(12) United States Patent
Park

(10) Patent No.: US 9,755,050 B2
(45) Date of Patent: Sep. 5, 2017

(54) SEMICONDUCTOR DEVICE

(71) Applicant: Samsung Electronics Co., Ltd., Suwon-si, Gyeonggi-do (KR)

(72) Inventor: Je-min Park, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 2 days.

(21) Appl. No.: 15/174,392

(22) Filed: Jun. 6, 2016

(65) Prior Publication Data
US 2016/0284702 A1    Sep. 29, 2016

Related U.S. Application Data

(63) Continuation of application No. 14/284,952, filed on May 22, 2014, now Pat. No. 9,391,202.
(Continued)

(30) Foreign Application Priority Data

Dec. 5, 2013   (KR) .................. 10-2013-0150841

(51) Int. Cl.
*H01L 29/772*    (2006.01)
*H01L 29/66*    (2006.01)
(Continued)

(52) U.S. Cl.
CPC .. *H01L 29/6656* (2013.01); *H01L 21/823468* (2013.01); *H01L 21/823864* (2013.01);
(Continued)

(58) Field of Classification Search
CPC ....... H01L 2029/785; H01L 21/823864; H01L 29/6653; H01L 29/66553; H01L 29/6656; H01L 29/66689; H01L 21/823468
See application file for complete search history.

(56) References Cited

U.S. PATENT DOCUMENTS 5,221,632 A    6/1993  Kurimoto et al.
6,764,966 B1 *  7/2004  En .................... H01L 29/6656
                                        257/E21.423
(Continued)

FOREIGN PATENT DOCUMENTS

KR    2004-0049121 A    6/2004

*Primary Examiner* — Fei Fei Yeung Lopez
(74) *Attorney, Agent, or Firm* — Harness, Dickey & Pierce, P.L.C.

(57) ABSTRACT

The semiconductor device including: a semiconductor layer extending in a first direction, the semiconductor layer including a pair of source/drain regions and a channel region, a gate extending on the semiconductor layer to cover the channel region, and a gate dielectric layer interposed between the channel region and the gate, a corner insulating spacer having a first surface and a second surface, the first surface extending in the second direction along a side wall of the gate, the first surface covering from a side portion of the gate dielectric layer to at least a portion of the side wall of the gate, and the second surface covering a portion of the semiconductor layer, and an outer portion insulating spacer covering the side wall of the gate above the corner insulating spacer, the outer portion insulating spacer having a smaller dielectric constant than the corner insulating spacer, may be provided.

20 Claims, 33 Drawing Sheets

Related U.S. Application Data

(60) Provisional application No. 61/881,627, filed on Sep. 24, 2013.

(51) Int. Cl.
*H01L 29/78* (2006.01)
*H01L 21/8234* (2006.01)
*H01L 21/8238* (2006.01)
*H01L 29/417* (2006.01)
*H01L 27/088* (2006.01)
*H01L 29/06* (2006.01)

(52) U.S. Cl.
CPC ........ *H01L 27/088* (2013.01); *H01L 27/0886* (2013.01); *H01L 29/0603* (2013.01); *H01L 29/0649* (2013.01); *H01L 29/41791* (2013.01); *H01L 29/6653* (2013.01); *H01L 29/66553* (2013.01); *H01L 29/66689* (2013.01); *H01L 29/66795* (2013.01); *H01L 29/785* (2013.01)

(56) References Cited

U.S. PATENT DOCUMENTS

| | | |
|---|---|---|
| 7,679,135 B2 | 3/2010 | Schulz |
| 7,915,682 B2 | 3/2011 | Hsu et al. |
| 7,939,889 B2 | 5/2011 | Yu et al. |
| 8,174,055 B2 | 5/2012 | Bonser et al. |
| 8,264,048 B2 | 9/2012 | Rachmady et al. |
| 8,278,179 B2 | 10/2012 | Lin et al. |
| 8,362,572 B2 | 1/2013 | Huang et al. |
| 8,492,230 B2 | 7/2013 | Ishikawa et al. |
| 2004/0150029 A1 | 8/2004 | Lee |
| 2005/0093067 A1* | 5/2005 | Yeo .............. H01L 21/84 257/348 |
| 2007/0114604 A1 | 5/2007 | Huang et al. |
| 2012/0193713 A1 | 8/2012 | Kulkarni et al. |
| 2013/0095629 A1 | 4/2013 | Ando et al. |
| 2013/0187264 A1 | 7/2013 | Tan et al. |

* cited by examiner

SEMICONDUCTOR DEVICE

CROSS-REFERENCE TO RELATED APPLICATIONS

This application is a continuation application of U.S. application Ser. No. 14/284,952, filed May 22, 2014, which claims priority under 35 U.S.C. §119 to U.S. Provisional Application No. 61/881,627, filed on Sep. 24, 2013, in the U.S. Patent and Trademark office, and Korean Patent Application No. 10-2013-0150841, filed on Dec. 5, 2013, in the Korean Intellectual Property Office, the disclosures of each of which are incorporated herein in their entirety by reference.

BACKGROUND

The inventive concepts relate to semiconductor devices, and more particularly, to semiconductor devices including a transistor.

As miniaturization and high integration of integrated circuit devices progress, operation stability of transistors becomes important in determining the performance of the integrated circuits. Accordingly, various efforts have been made to improve operation characteristics, for example, a speed of operation, power consumption, and economic efficiency of the transistors.

SUMMARY

The inventive concepts provide semiconductor devices including a transistor having reduced fringing capacitance and parasitic capacitance, and thereby exhibiting improved speed of operation and reduced power consumption.

According to an example embodiment, a semiconductor device may include a semiconductor layer extending in a first direction, the semiconductor layer including a pair of source/drain regions and a channel region extending between the pair of the source/drain regions, a gate extending in a second direction on the semiconductor layer to cover the channel region, a gate dielectric layer interposed between the channel region and the gate, a corner insulating spacer having a first surface and a second surface, the first surface extending in the second direction along a side wall of the gate, the first surface covering from a side portion of the gate dielectric layer to at least a portion of the side wall of the gate, and the second surface covering a portion of the semiconductor layer, and an outer portion insulating spacer covering the side wall of the gate above the corner insulating spacer, the outer portion insulating spacer having a dielectric constant smaller than that of the corner insulating spacer.

The side wall of the gate may have a first height, and the first surface of the corner insulating spacer may cover the side wall of the gate up to a second height which is smaller than the first height.

The outer portion insulating spacer may have a surface meeting the side wall of the gate.

The outer portion insulating spacer may have a third height which is greater than the first height.

The semiconductor layer may be a portion of a bulk semiconductor substrate.

The corner insulating spacer may extend along the side wall of the gate in a re-entrant corner portion formed between the gate, the pair of the source/drain regions, and the semiconductor layer.

The semiconductor device may further include a semiconductor fin protruding from the semiconductor substrate and extending in the first direction.

The semiconductor device may further include a device isolation layer contacting both side walls of the semiconductor fin on the semiconductor substrate, the device isolation layer having a top surface under a top surface of the semiconductor fin. The gate may extend in the second direction on the semiconductor fin and on the device isolation layer. The corner insulating spacer may extend from the semiconductor fin along the side wall of the gate in the re-entrant corner formed between the gate, the semiconductor fin, and the device isolation layer.

The semiconductor device may further include a buried insulating layer interposed between the substrate and the gate dielectric layer and a semiconductor fin protruding from the semiconductor layer and extending in the first direction on the buried insulating layer, the semiconductor fin having a base portion contacting the buried insulating layer.

The gate may extend in the second direction on the semiconductor fin and on the buried insulating layer. The corner insulating spacer may extend from the semiconductor fin along the side wall of the gate in the re-entrant corner formed between the gate, the semiconductor fin, and the buried insulating layer.

The pair of the source/drain regions may include a pair of source/drain extension regions having a first impurity doping concentration, and a pair of deep source/drain regions having a second impurity doping concentration, the second impurity doing concentration being higher than the first doping concentration. The corner insulating spacer may cover the source/drain extension region by a width smaller than a distance horizontally spaced apart between the gate and the deep source/drain region from the side wall of the gate.

The corner insulating spacer may have a horizontal width selected within a range of a half of the horizontal distance between the gate and the deep source/drain region from the side wall of the gate.

According to an example embodiment, a semiconductor device may include a semiconductor layer having a channel region and extending in a first direction, an insulating layer covering at least a portion of the semiconductor layer, a gate extending in a second direction that crosses the semiconductor layer on the channel region and on the insulating layer, a gate dielectric layer interposed between the channel region and the gate, a corner insulating spacer having a first surface and a second surface, the first surface extending from the semiconductor layer along a side wall of the gate, the first surface covering at least a portion of the side wall of the gate, and the second surface covering a portion of the semiconductor layer, and an outer portion insulating spacer covering the side wall of the gate above the corner insulating spacer, the outer portion insulating spacer having a smaller dielectric constant than the corner insulating spacer.

The corner insulating spacer may have a width smaller than a horizontal distance from the side wall of the gate to an outer wall of the outer portion insulating spacer in the first direction.

The corner insulating spacer may have a third surface covering the insulating layer by a width that is smaller than the horizontal distance from the side wall of the gate to the outer wall of the outer portion insulating spacer in the first direction.

According to an example embodiment, a semiconductor device may include a semiconductor layer having a channel region and extending in a first direction, a gate extending crossing the channel region of the semiconductor layer in a second direction, the second direction being off-axis with respect to the first direction, a gate dielectric layer between the channel region and the gate, an inner insulating spacer covering sidewall of the gate dielectric layer and at least a portion of a side wall of the gate, and an outer insulating spacer covering the inner insulating spacer and covering the remaining side wall of the gate, the outer portion insulating spacer having a smaller dielectric constant than the inner insulating spacer.

The semiconductor device may further include a pair of source/drain regions at both sides of the gate, the pair of source/drain regions including a pair of source/drain extension regions having a first impurity doping concentration, and a pair of deep source/drain regions having a second impurity doping concentration, the second impurity doping concentration being higher than the first impurity doping concentration.

The inner insulating spacer horizontally may cover the source/drain regions from the side wall of the gate to a horizontal boundary between the source/drain extension regions and the deep source/drain regions.

The inner insulating spacer horizontally may cover the source/drain regions less than a set distance, the set distance being half of the distance between the side wall of the gate and a horizontal boundary between the source/drain extension regions and the deep source/drain regions.

The semiconductor layer may be a protruded structure from a substrate and extend in a first direction and the gate may cross the semiconductor layer in a second direction, the gate covering a top and a side surface of the semiconductor layer at a crossing area, the second direction being off-axis with respect to the first direction.

BRIEF DESCRIPTION

Example embodiments will be more clearly understood from the following detailed description taken in conjunction with the accompanying drawings in which:

FIGS. 4A through 4C are views for describing main elements of a semiconductor device according to another example embodiment, wherein FIG. 4A is a perspective view of a portion of the semiconductor device, FIG. 4B is a vertical cross-sectional view taken along line 4B-4B' of FIG. 4A, and FIG. 4C is a vertical cross-sectional view taken along line 4C-4C' of FIG. 4A;

FIGS. 7A and 7B are views for describing main elements of a semiconductor device according to still another example embodiment, wherein FIG. 7A is a perspective view of a portion of the semiconductor device and FIG. 7B is a vertical cross-sectional view taken along line 7B-7B' of FIG. 7A;

DETAILED DESCRIPTION

Figure 1:
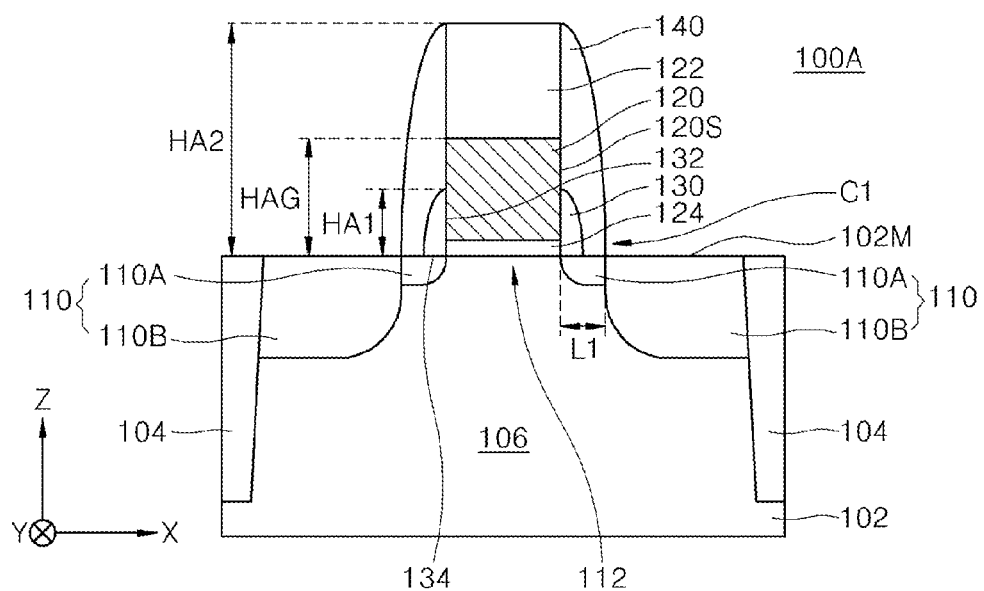
FIG. 1 is a cross-sectional view of a semiconductor device according to an example embodiment.

Hereinafter, the inventive concepts will now be described more fully with reference to the accompanying drawings, in which some example embodiments of the inventive concepts are shown. Like reference numerals in the drawings denote like elements, and a repeated explanation will not be given of overlapped features.

These inventive concepts may, however, be embodied in different forms and should not be construed as limited to the example embodiments set forth herein. Rather, these example embodiments are provided so that this disclosure is thorough and complete and fully conveys the inventive concepts to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms "first", "second", "third", etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments. For example, a first element could be termed a second element, and, similarly, a second element could be termed a first element, without departing from the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. A specific process order may be performed differently from the described order in connection with some example embodiments. For example, two consecutively described processes may be performed substantially at the same time or performed in an order opposite to the described order.

In the drawings, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

As used herein, the term "and/or" includes any and all combinations of one or more of the associated listed items. Expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments will be explained in further detail with reference to the accompanying drawings.

FIG. 1 is a cross-sectional view of a semiconductor device 100A according to an example embodiment. FIG. 1 illustrates the semiconductor device 100A including a metal oxide semiconductor (MOS) transistor realized on a bulk semiconductor substrate 102.

An active region 106 may be defined by a device isolation layer 104 on the semiconductor substrate 102. The active region 106 may include a pair of source/drain regions 110, and a channel region 112 extending between the pair of source/drain regions 110.

The semiconductor substrate 102 may include silicon (Si) (e.g., polysilicon, polycrystalline silicon, or amorphous silicon). According to other example embodiments, the semiconductor substrate 102 may include other semiconductor materials, for example, germanium (Ge), or a compound semiconductor (e.g., silicon germanium (SiGe), silicon carbide (SiC), gallium arsenide (GaAs), indium arsenide (InAs), or indium phosphide (InP)).

A gate 120 may be formed to cover the active region 106 between the pair of source/drain regions 110 on the semiconductor substrate 102. The gate 120 may have a side wall 120S extending from a cylindrical surface 102M of the semiconductor substrate 102 to a desired (or alternatively, predetermined) height HAG in a direction (direction Z in FIG. 1) perpendicular to an extension direction of the cylindrical surface 102M. Hereinafter, unless otherwise defined, "height" refers to a minimum distance in a direction (direction Z in FIG. 1) perpendicular to the extension direction of the cylindrical surface 102M of the semiconductor substrate 102.

According to some example embodiments, the gate 120 may be formed of, for example, doped polysilicon, metal, conductive metal nitride, metal silicide, alloys, or a combination thereof. For example, the gate 120 may include at least one metal selected from Al, Ti, Ta, W, Ru, Nb, Mo, or Hf, or nitride thereof.

A top surface of the gate 120 may be covered by an insulating capping layer 122. According to some example embodiments, the insulating capping layer 122 may be formed of, for example, a silicon nitride layer, a silicon oxide layer, or a combination thereof.

A gate dielectric layer 124 may be interposed between the channel region 112 and the gate 120. According to some example embodiments, the gate dielectric layer 124 may be formed of, for example, a silicon oxide layer or a high dielectric layer having a higher dielectric constant than the silicon oxide layer.

At both sides of the gate 120, a pair of corner insulating spacers 130, each of which extends along the side wall 120S of the gate 120 and a top surface of the source/drain region 110, may be formed.

The pair of corner insulating spacers 130 may extend along the side wall 120S of the gate 120 in a pair of re-entrant corner portions C1 formed between the gate 120 and the pair of source/drain regions 110.

Each of the corner insulating spacers 130 may have a first surface 132 covering from a side portion of the gate dielectric layer 124, which is adjacent to the side wall 120S of the gate 120, to at least a portion of the side wall 120S of the gate 120, and a second surface 134 covering from a side portion of the gate dielectric layer 124 to a portion of the source/drain region 110.

The first surface 132 of the pair of corner insulating spacers 130 may directly contact the at least the portion of the side wall 120S of the gate 120. The second surface 134 may directly contact the portion of the source/drain region 110.

As illustrated in FIG. 1, the first surface 132 of the pair of corner insulating spacers 130 may cover the side wall 120S up to a first height HA1 which is smaller than the height HAG of the side wall 120S of the gate 120. For example, the first surface 132 of the pair of corner insulating spacers 130 may cover the side wall 120S to various heights within a range that is not greater than the height HAG of the side wall 120S of the gate 120.

Above the pair of corner insulating spacers 130, a pair of outer portion insulating spacers 140 may be formed. The pair of outer portion insulating spacers 140 may extend to a second height HA2, which is greater than the first height HA1 on the semiconductor substrate 102. In FIG. 1, it is illustrated that the second height HA2 of the pair of outer portion insulating spacers 140 may reach a top surface of the insulating capping layer 122. However, example embodiments are not limited thereto. For example, the second height HA2 of the outer portion insulating spacer 140 may vary within the range of the height HAG of the side wall 120S of the gate 120 and a combined height of the gate 120 and the insulating capping layer 122.

Each of the outer portion insulating spacers 140 may have a surface facing the remaining portion of the side wall 120S of the gate 120, which is not covered by the corner insulating spacer 130. Each of the outer portion insulating spacers 140 may have a surface directly contacting the remaining portion of the side wall 120S of the gate 120, which is not covered by the corner insulating spacer 130. According to some example embodiments, the side wall 120S of the gate 120 may be completely covered by the corner insulating spacer 130 and the outer portion insulating spacer 140 may cover a side wall of the insulating capping layer 122 above the corner insulating spacer 130.

The outer portion insulating spacers 140 have a dielectric constant that is smaller than that of the corner insulating spacers 130.

According to some example embodiments, the pair of corner insulating spacers 130 may be formed of a high dielectric layer whose dielectric constant is greater than that of a silicon oxide layer. For example, the pair of corner insulating spacers 130 may have a dielectric constant of about 10 to about 25. According to some example embodiments, the pair of corner insulating spacers 130 may be formed of, for example, at least one selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, or PbScTaO, but example embodiments are not limited thereto.

For example, the pair of corner insulating spacers 130 may be formed of, for example, a silicon oxide layer. In this case, the pair of outer portion insulating spacers 140 may be formed as a layer having a smaller dielectric constant than the silicon oxide layer. For example, at least a portion of each of the outer portion insulating spacers 140 may be formed of, for example, an air spacer. According to some example embodiments, the pair of outer portion insulating spacers 140 may be formed of, for example, a silicon oxide spacer, a silicon nitride spacer, an air spacer, or a combination thereof. According to some example embodiments, the pair of corner insulating spacers 130 may be formed of, for example, a silicon oxide layer, and the pair of outer portion insulating spacers 140 may have, for example, a multi-layered structure including air spacers. For example, the pair of outer portion insulating spacers 140 may be formed of, for example, a double-layered structure including an air spacer neighbouring the corner insulating spacer 130 and a silicon oxide layer distanced from the corner insulating spacer 130 with the air spacer interposed between the silicon oxide layer and the corner insulating spacer 130. According to other example embodiments, the pair of corner insulating spacers 130 may be formed of, for example, a silicon nitride layer, and the pair of outer portion insulating spacers 140 may have a single-layered structure including a silicon oxide layer or a multi-layered structure including air spacers. According to other example embodiments, the pair of corner insulating spacers 130 may be formed of, for example, a hafnium oxide layer, and the pair of outer portion insulating spacers 140 may be formed of, for example, a silicon oxide layer, a silicon nitride layer, an air spacer, or a combination thereof. Combinations of materials of the pair of corner insulating spacers 130 and the pair of outer portion insulating spacers 140 according to example embodiments are not limited to what is described above. Various combinations are possible as long as the corner insulating spacers 130 are formed of a relatively high dielectric insulating material and the outer portion insulating spacers 140 are formed of a material having a relatively small dielectric constant than the corner insulating spacers 130.

Each of the pair of source/drain regions 110 may include a source/drain extension region 110A having a relatively low impurity doping concentration and a deep source/drain region 110B having a relatively high impurity doping concentration than the source/drain extension region 110A.

Each of the corner insulating spacers 130 may cover the source/drain extension region 110A by a smaller width than a desired (or alternatively, predetermined) horizontal distance L1 from the side wall 120S of the gate 120. In this specification, unless otherwise defined, the "horizontal distance" refers to a minimum distance in the extension direction of the main surface of the semiconductor substrate 102, particularly, in a direction identical with a direction (direction X in FIG. 1) of a channel formed in the active region 106.

According to some example embodiments, the horizontal distance L1 may be a horizontal distance from the side wall 120S of the gate 120 to the deep source/drain region 110B. That is, each of the corner insulating spacers 130 may cover the source/drain extension region 110A by a smaller width than the horizontal distance L1 from the side wall 120S of the gate 120 to the deep source/drain region 110B. According to other example embodiments, the horizontal distance L1 may be a horizontal distance that is from the side wall 120S of the gate 120 to an outer wall of the outer portion insulating spacer 140. That is, each of the corner insulating spacers 130 may cover the source/drain extension region 110A by a smaller width than the horizontal distance L1 that is from the side wall 120S of the gate 120 to the outer wall of the outer portion insulating spacer 140.

According to some example embodiments, the pair of corner insulating spacers 130 may have a horizontal width selected within a range of a half of the horizontal distance L1, which is a distance from the side wall 120S of the gate 120 to a point between the gate 120 and the deep source/drain region 110B. According to other example embodiments, the pair of corner insulating spacers 130 may have a horizontal width selected within a range of a half of the horizontal distance L1, which is a distance from the side wall 120S of the gate 120 to the outer wall of the outer portion insulating spacer 140.

In the semiconductor device 100A illustrated in FIG. 1, the insulating spacers may be formed in the re-entrant corner portion C1 formed between the source/drain region 110 and the side wall 120S of the gate 120. Among the insulating spacers, the corner insulating spacer 130, which is formed of an insulating material having a relatively high dielectric constant, may be disposed as an inner portion. This inner portion (i.e., corner insulating spacer 130) has relatively large effects on the performance of the transistor than the other insulating spacers. For example, due to the presence of the inner portion (i.e., corner insulating spacer 130), fringing capacitance may be prevented from occurring between the source/drain region 110 and the gate 120. Therefore, a current flow "ON" characteristic and a current flow "OFF" characteristic may be improved, and a deterioration of the performance of the transistor may be prevented. The outer portion insulating spacer 140, which is formed of an insulating material having a smaller dielectric constant than the corner insulating spacer 130, may be disposed as an outer portion. Among the insulating spacers formed in the re-entrant corner portions C1 at both sides of the gate 120, this outer portion has relatively small effects on the performance of the transistor. For example, due to the presence of the outer portion insulating spacer 140, parasitic capacitance in the semiconductor device 100A may be reduced. Therefore, a speed of operation of the transistor including the gate 120 may be improved and power consumption may be reduced.

Figure 2:
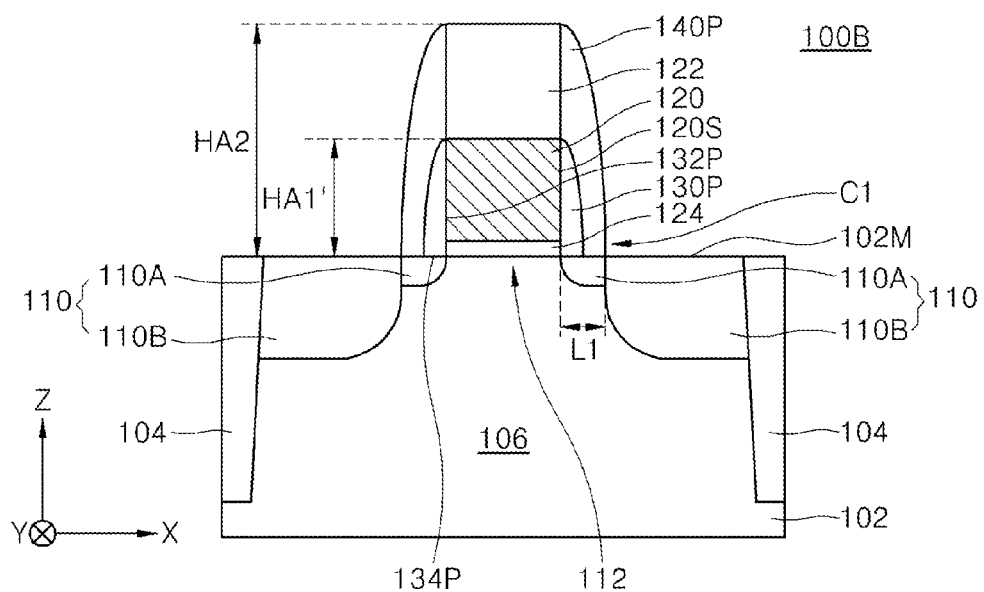
FIG. 2 is a cross-sectional view of a semiconductor device according to another example embodiment.

FIG. 2 is a cross-sectional view of a semiconductor device 100B according to another example embodiment of the inventive concept. In FIG. 2, like reference numerals denote the like elements in FIG. 1, and their detailed description will not be repeated here.

Referring to FIG. 2, the semiconductor device 100B may include a pair of corner insulating spacers 130P at both sides of the gate 120, which extend along the side walls 120S of the gate 120 and top surfaces of the source/drain regions 110.

The corner insulating spacer 130P may have a first surface 132P covering from a side portion of the gate dielectric layer 124, which is adjacent to the side wall 120S of the gate 120, to the side wall 120S of the gate 120, and a second surface 134P covering from a side portion of the gate dielectric layer 124 to a portion of the source/drain region 110. The first surface 132P may have a height HA1' that may cover the side wall 120S of the gate 120 up to the top surface of the gate 120. Thus, the first surface 132P may materially cover the entire side wall 120S of the gate 120. The first surface 132P may directly contact the side wall 120S of the gate 120. The second surface 134P may directly contact the portion of the source/drain region 110.

A pair of outer portion insulating spacers 140P covering the pair of corner insulating spacers 130P is separated from the gate 120 with the pair of corner insulating spacers 130P between the pair of outer portion insulating spacers 140P and the gate 120. The pair of outer portion insulating spacers 140P may cover at least portions of both side walls of the insulating capping layer 122.

The outer portion insulating spacers 140P have a smaller dielectric constant than the pair of corner insulating spacers 130P. More detailed descriptions of the pair of corner insulating spacers 130P and the pair of outer portion insulating spacers 140P are respectively the same as or substantially similar to those provided with reference to FIG. 1 and thus are omitted to avoid redundancy.

In the semiconductor device 100B illustrated in FIG. 2, the insulating spacers may be formed in the re-entrant corner portion C1 formed between the source/drain region 110 and the side wall 120S of the gate 120 that are formed on the semiconductor substrate 102. Among the insulating spacers, the corner insulating spacer 130P, which is formed of an insulating material having a relatively high dielectric constant, may be disposed as an inner portion. This inner portion has relatively large effects on the performance of the transistor than the other insulating layers. For example, due to the presence of the inner portion (i.e., corner insulating spacer 130P), fringing capacitance may be prevented from occurring between the source/drain region 110 and the gate 120. Therefore, a current flow "ON" characteristic and a current flow "OFF" characteristic may be improved, and a deterioration of the performance of the transistor may be prevented. The outer portion insulating spacer 140P, which is formed of an insulating material having a smaller dielectric constant than the corner insulating spacer 130P, may be disposed as an outer portion. Among the insulating spacers formed in the re-entrant corner portions C1 at both sides of the gate 120, this outer portion has relatively small effects on the performance of the transistor. For example, due to the presence of the outer portion insulating spacer 140P, parasitic capacitance may be reduced in the semiconductor device 100B. Therefore, a speed of operation of the transistor including the gate 120 may be improved and power consumption may be reduced.

FIGS. 3A through 3F are cross-sectional views for describing an order of processes for manufacturing a semiconductor device, according to an example embodiment. According to the present example embodiment, descriptions will be made of a method of manufacturing the semiconductor device 100A illustrated in FIG. 1. However, within the scope of the present inventive concepts, the method described with reference to FIGS. 3A through 3F also applies to the semiconductor device 100B illustrated in FIG. 2. In FIGS. 3A through 3F, like reference numerals denote the like elements in FIG. 1, and thus, their descriptions will not be repeated here.

Figure 3A:
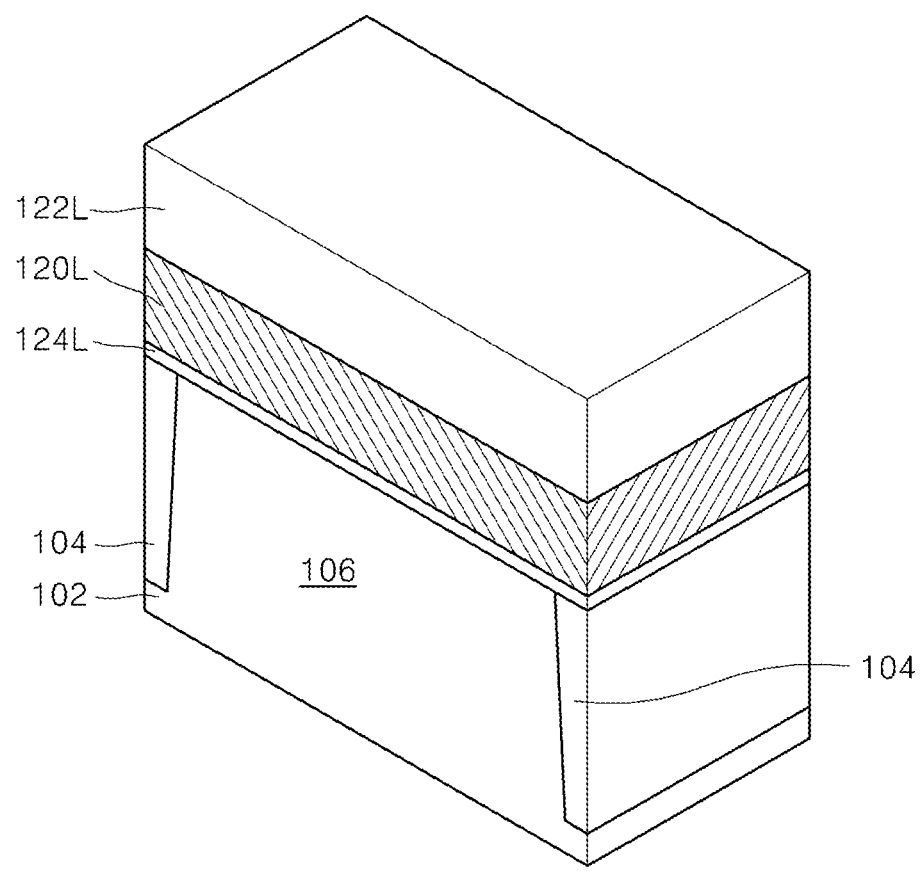
FIGS. 3A through 3F are cross-sectional views for describing an order of processes for manufacturing a semiconductor device, according to an example embodiment.

Referring to FIG. 3A, the device isolation layer 104 defining the active region 106 may be formed in the semiconductor substrate 102.

The device isolation layer 104 may be formed of, for example, a silicon oxide layer, a silicon nitride layer, or a combination thereof.

A dielectric layer 124L, a conductive layer 120L, and an insulating layer 122L may be sequentially formed on the semiconductor substrate 102.

The dielectric layer 124L may be formed of, for example, a silicon oxide or a high dielectric layer. According to some example embodiments, the high dielectric layer may be formed of, for example, at least a material selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO. According to some example embodiments, an atomic layer deposition (ALD) process, a chemical vapor deposition (CVD) process, or a thermal oxidation process may be used to form a high dielectric layer 124L.

The conductive layer 120L may be formed of, for example, doped polysiliconlicon, conductive metal nitride, metal silicide, alloys, or a combination thereof. For example, the conductive layer 120L may include nitride of at least one metal selected from Al, Ti, Ta, W, Ru, Nb, Mo, or Hf. The conductive layer 120L may be a single layer or a plurality of layers. According to some example embodiments, to form the conductive layer 120L, a CVD process, a metal organic CVD (MOCVD) process, an ALD process, or a metal organic ALD (MOALD) process may be used, but example embodiments are not limited thereto.

The insulating layer 122L may be formed of, for example, a silicon nitride layer, a silicon oxide layer, or a combination thereof.

Figure 3B:
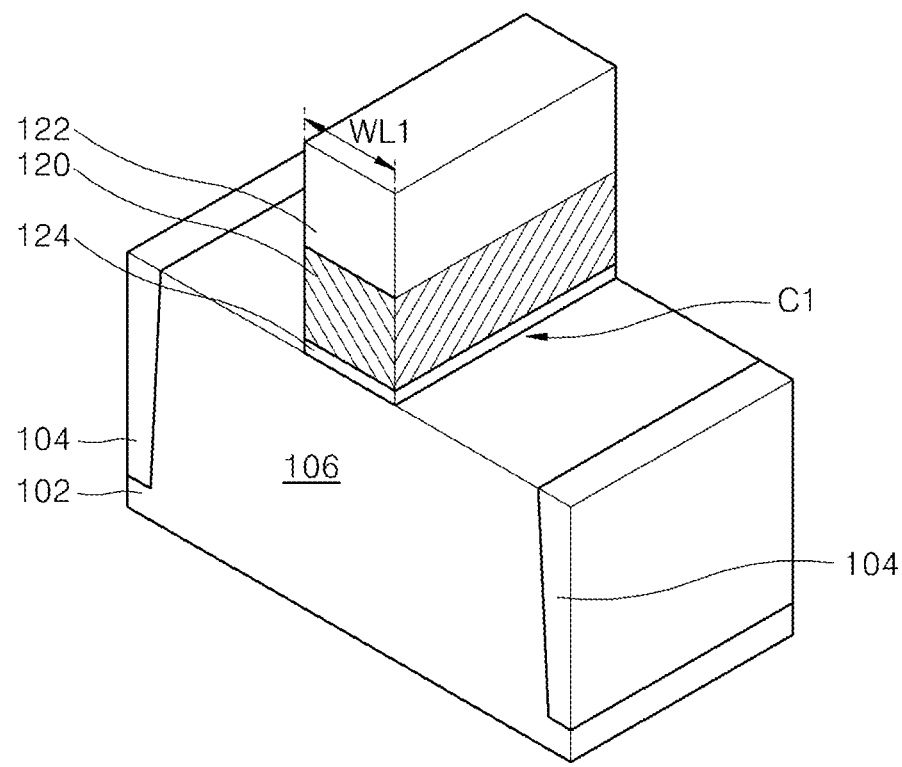

Referring to FIG. 3B, after a mask pattern (not shown) may be formed on the insulating layer 122L illustrated in FIG. 3A, the insulating layer 122L is etched by using the mask pattern as an etch mask to form the insulating capping layer 122. Then, the conductive layer 120L and the dielectric layer 124L may be sequentially etched by using the insulating capping layer 122 as an etch mask to form the gate 120 and the gate dielectric layer 124.

According to some example embodiments, the gate 120 may be formed to have a line width WL1 of about 10 to about 30 nm. In this case, the gate 120 may have a length corresponding to the line width WL1. However, the line width WL1 of the gate 120 according to example embodiments is not limited to what is described above, but may vary.

The re-entrant corner portions C1, in which the gate dielectric layer 124 may be exposed, are formed at both sides of the gate 120 between the gate 120 and the semiconductor substrate 102.

Figure 3C:
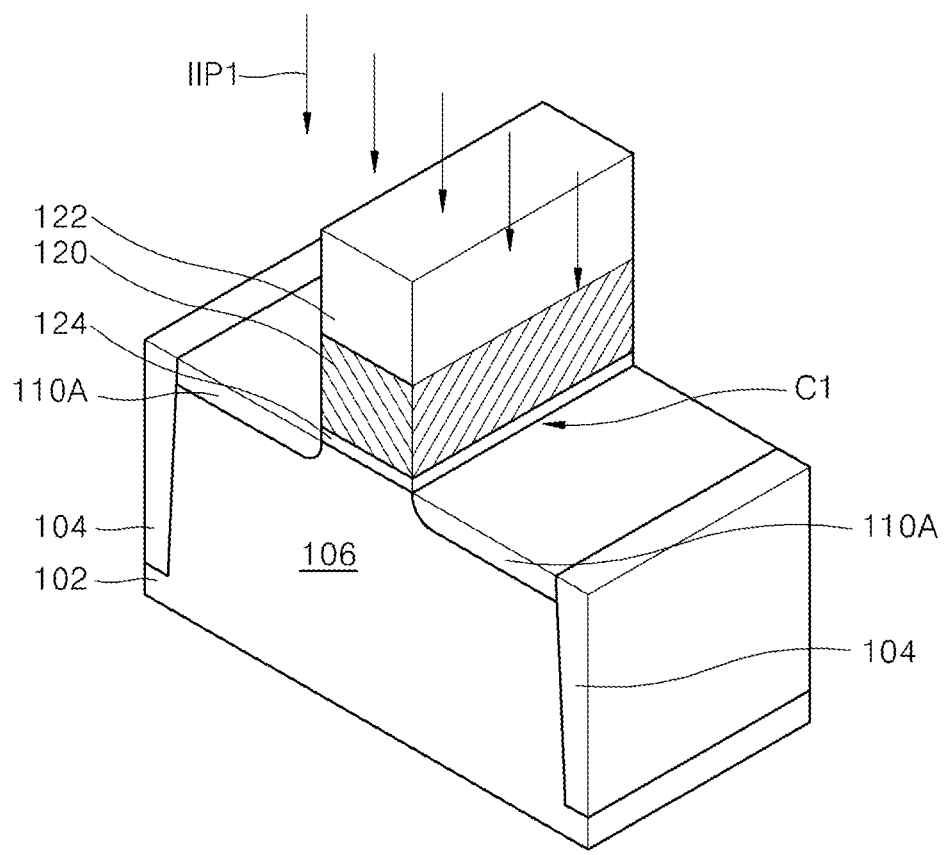

Referring to FIG. 3C, the source/drain extension regions 110A that have a relatively shallow depth in the semiconductor substrate 102 may be formed at the both sides of the gate 120 by implanting impurity ions IIP1 having a first doping concentration into the semiconductor substrate 102 by using the insulating capping layer 122 as an ion implantation mask. The first doping concentration of the impurity ions IIP1 may be variously determined according to a design of the semiconductor device 100A.

According to some example embodiments, the process of implanting the impurity ions IIP1 to form the source/drain extension regions 110A may not be performed at this stage, but may instead be performed after a process of forming the pair of corner insulating spacers 130 as will be described with reference to FIG. 3D.

According to some example embodiments, before performing the impurity ions IIP1 implantation process for forming the source/drain extension regions 110A, an thin oxide layer to protect an exposed surface of the semiconductor substrate 102 and an exposed surface of the gate 120 may be formed prior to forming the source/drain extension regions 110A. After forming the source/drain extension regions 110A, the thin oxide layer may be removed by an wet etch process.

Figure 3D:
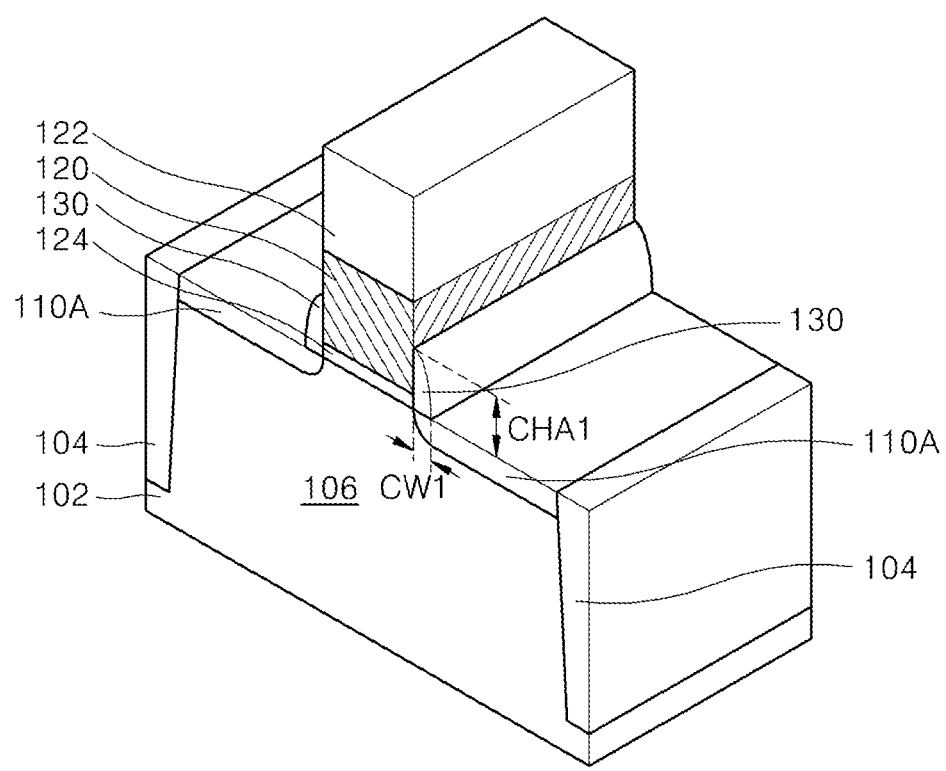

Referring to FIG. 3D, the corner insulating spacer 130 may be formed in the re-entrant corner portion C1 by etchback of a first insulating spacer layer (not shown) after forming the first insulating spacer layer (not shown) extending conformingly along a structure of a stack of the gate 120 and the insulating capping layer 122, and the exposed surface of the semiconductor substrate 102.

According to some example embodiments, the corner insulating spacer 130 may have a shape such that one of the pair of corner insulating spacers 130 is at one side of the gate 120 and the other of the pair of corner insulating spacers 130 is at the other side of the gate 120. According to other example embodiments, the corner insulating spacer 130 may have a ring shape that surrounds the gate 120.

A width CW1 of the corner insulating spacer 130 may be controlled by a thickness of the first insulating spacer layer (not shown). A height CHA1 of the pair of corner insulating spacers 130 may be controlled by the time during which the etchback process of the first insulating spacer layer (not shown) is performed. According to some example embodiments, the width CW1 of the corner insulating spacer 130 may be selected within a range of about 1 to about 20 nm, and the height CHA1 of the corner insulating spacer 130 may be selected within a range of about 3 to about 60 nm, but they are not limited thereto. The height CHA1 of the pair of corner insulating spacers 130 may correspond to the first height HA1 illustrated in FIG. 1.

According to some example embodiments, the process of forming the source/drain extension regions 110A illustrated in FIG. 3C may not be performed prior to the process of forming the pair of corner insulating spacers 130. For example, the impurity ions IIP1 implantation process for forming the source/drain extension regions 110A may be performed after the process of forming the pair of corner insulating spacers 130, as illustrated in FIG. 3D. According to this example embodiment, after implanting the impurity ions IIP1 into the semiconductor substrate 102, the impurity ions IIP1 may be treated to diffuse in a horizontal direction up to an edge portion of the side wall 120S of the gate 120. By controlling the horizontal diffusion direction of the impurity ions IIP1 in the semiconductor substrate 102, an overlapping area between the gate 120 and the source/drain extension regions 110A may be properly adjusted (e.g., reduced). Accordingly, an effective gate length of the MOS transistor may increase. Also, a gate induced drain leakage (GIDL) occurring in the MOS transistor and overlap capacitance may be reduced or suppressed.

Figure 3E:
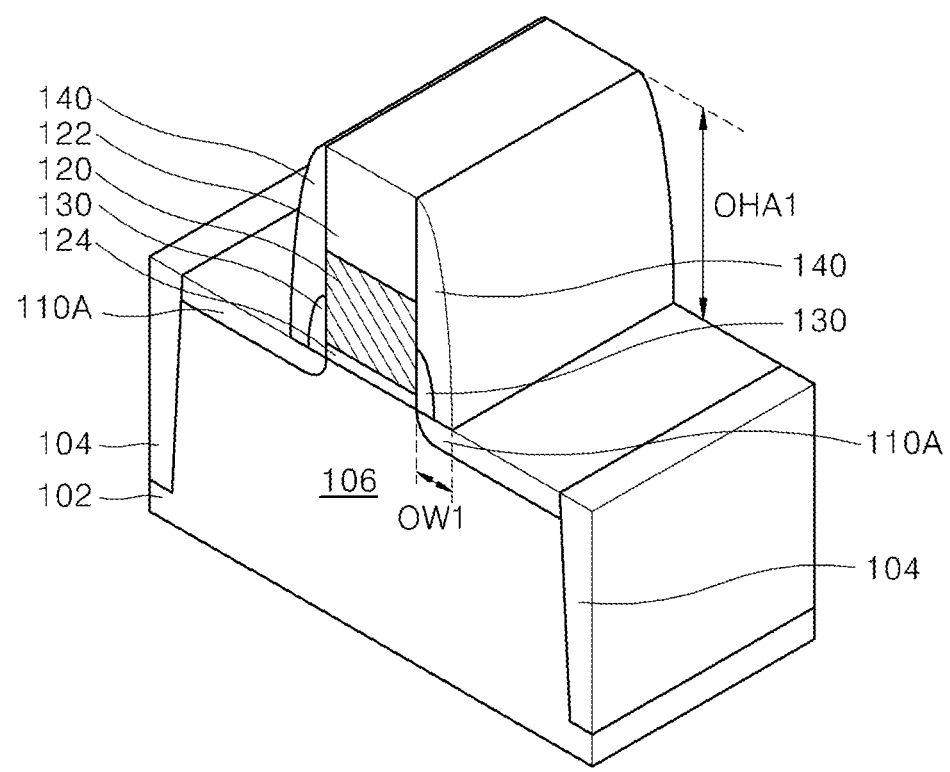

Referring to FIG. 3E, a second insulating spacer layer (not shown), which extends conformingly along an exposed surface of a stack of the gate 120, the insulating capping layer 122, and the corner insulating spacer 130, and the exposed surface of the semiconductor substrate 102, may be formed. Then, etchback may be performed on the second insulating spacer layer (not shown) to form the outer portion insulating spacer 140 covering the corner insulating spacer 130 in the re-entrant corner portion C1 (refer to FIG. 3C).

The second insulating spacer layer and the outer portion insulating spacer 140 obtained therefrom are formed of a material having a smaller dielectric constant than a material of the corner insulating spacer 130.

According to some example embodiments, the outer portion insulating spacer 140 may have a shape such that one of the pair of outer portion insulating spacers 140 is at one side of the gate 120 and the other of the pair of outer portion insulating spacers 140 is at the other side of the gate 120.

According to other example embodiments, the outer portion insulating spacer 140 may have a ring shape that surrounds the gate 120.

A width OW1 of the outer portion insulating spacer 140 may be controlled by a thickness of the second insulating spacer layer. A height OHA1 of the outer portion insulating spacer 140 may be controlled by the time during which the etchback process of the second insulating spacer layer (not shown) is performed. By controlling the width OW1 of the outer portion insulating spacer 140, a ratio of the width CW1 of the corner insulating spacer 130 to a width of a side wall spacer formed by the corner insulating spacer 130 and the outer portion insulating spacer 140 may be determined. The total width of the side wall spacers may correspond to the width OW1 of the outer portion insulating spacer 140. The height OHA1 of the outer portion insulating spacer 140 may correspond to the second height HA2 illustrated in FIG. 1.

Figure 3F:
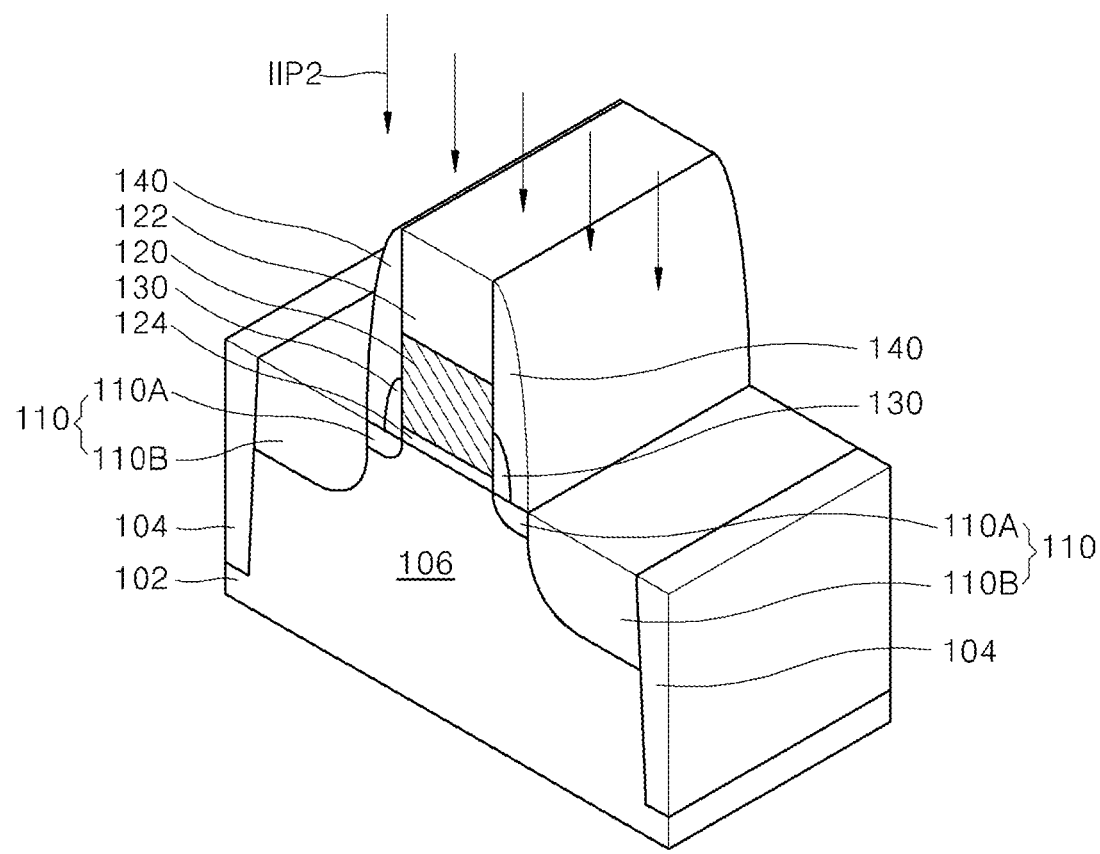

Referring to FIG. 3F, impurity ions IIP2 of a second doping concentration, which is higher than the first doping concentration, may be implanted into the semiconductor substrate 102 by using the insulating capping layer 122 and the outer portion insulating spacer 140 as ion implantation masks to form the pair of deep source/drain regions 110B at both sides of the gate 120 in the semiconductor substrate 102. According to some example embodiments, the second doping concentration of the impurity ions IIP2 may be variously determined according to a design of the semiconductor device 100A.

The source/drain extension region 110A and the deep source/drain region 110B may form the source/drain region 110.

According to some example embodiments, before implanting the impurity ions IIP2 to form the deep source/drain region 110B, an oxide thin layer may be formed to protect an exposed surface of the semiconductor substrate 102. After forming the deep source/drain region 110B, the oxide thin layer may be removed by a wet etch process.

Next, an interlayer insulating layer may be formed to cover the corner insulating spacer 130, the outer portion insulating spacer 140, and the pair of source/drain regions 110 and a typical contact forming process may be performed.

Figure 4A:
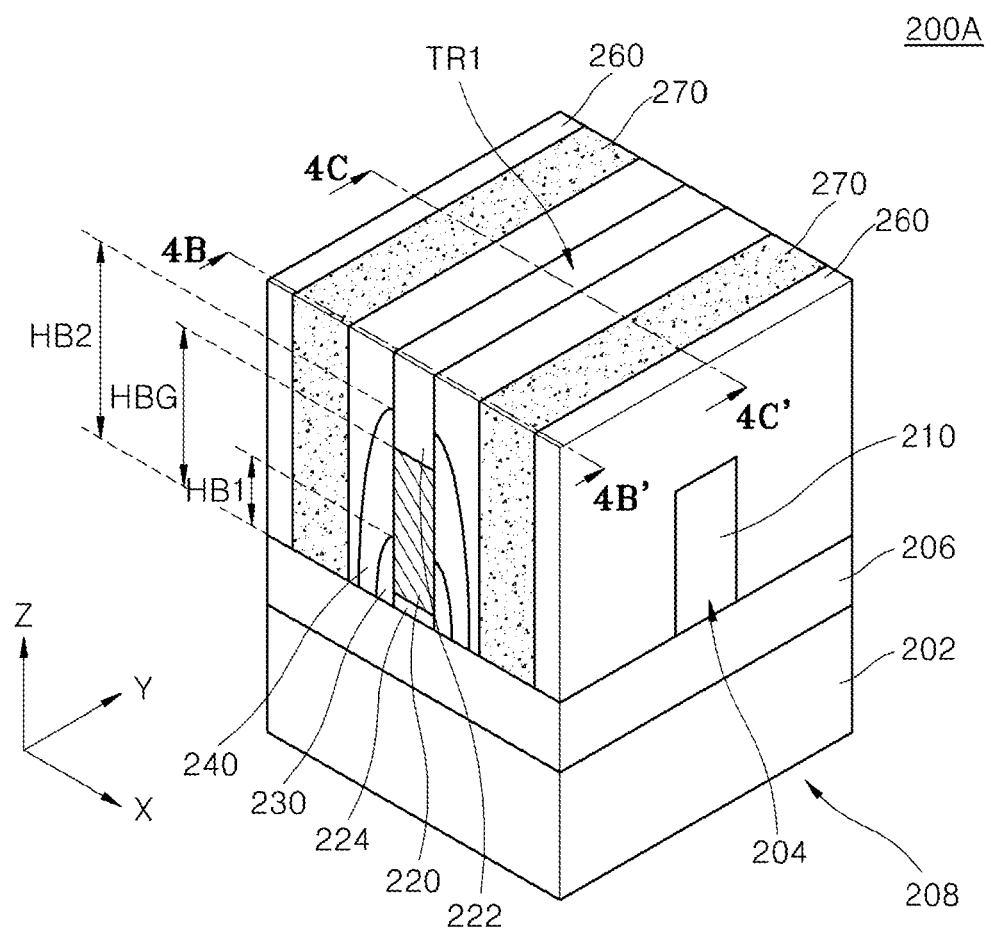
Figure 4B:
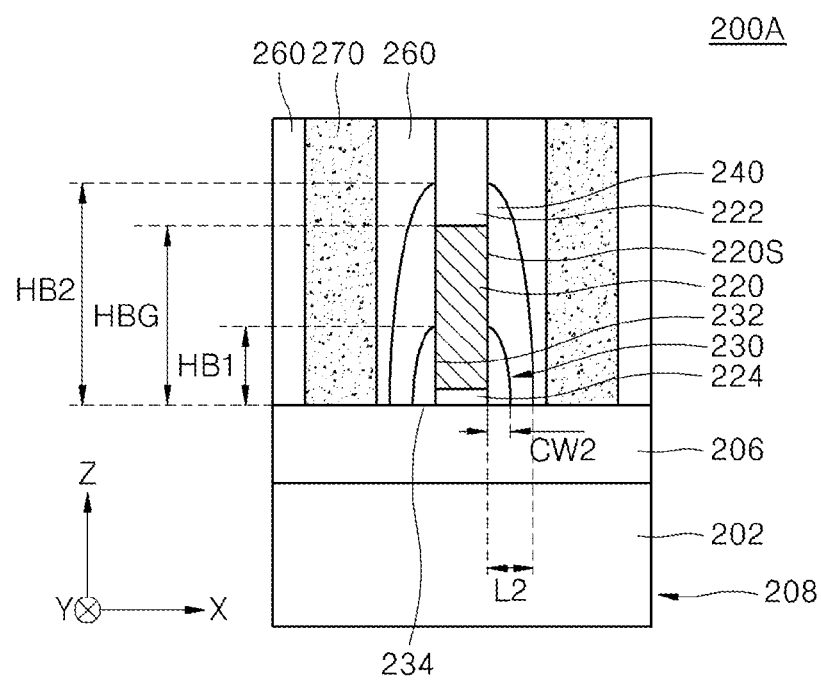
Figure 4C:
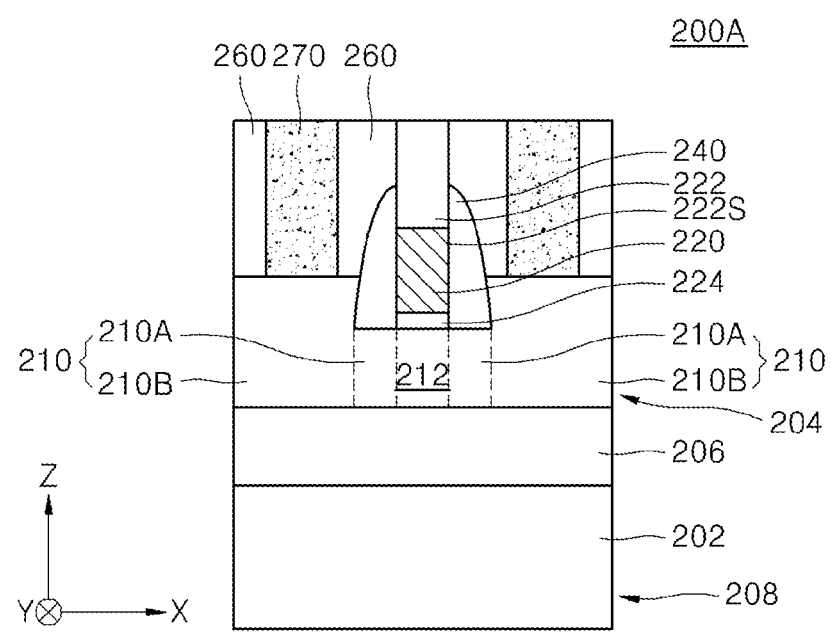

FIGS. 4A through 4C are views for describing main elements of a semiconductor device according to another example embodiment. FIG. 4A is a perspective view of a portion of the semiconductor device. FIG. 4B is a vertical cross-sectional view taken along line 4B-4B' of FIG. 4A. FIG. 4C is a vertical cross-sectional view taken along line 4C-4C' of FIG. 4A. FIGS. 4A through 4C illustrate the semiconductor device formed as a fin FET manufactured using an SOI wafer as an example.

The semiconductor device 200A may be formed on an SOI wafer 208 including a substrate 202, a semiconductor fin 204, and a buried insulating layer 206 interposed therebetween. The semiconductor fin 204 may extend in a direction (direction X in FIG. 4A) on the buried insulating layer 206. FIGS. 4A through 4C illustrate the semiconductor device 200A having one semiconductor fin 204 as an example. However, example embodiments are not limited thereto, and a semiconductor device according to example embodiments may include various numbers of semiconductor fins according to design requirements of a semiconductor device. Also, the number of semiconductor fins 204 may be determined depending on other factors, for example, a physical size of the fin FET forming the semiconductor device, an operation voltage, and/or a current flow.

According to some example embodiments, the substrate 202 may be formed of, for example, Si. According to some example embodiments, the semiconductor fin 204 may include Si (e.g., polysilicon, polycrystalline silicon, or amorphous silicon). According to other example embodiments, the semiconductor fin 204 may include Ge, or a compound semiconductor (e.g., SiGe, SiC, GaAs, InAs, or InP). The buried insulating layer 206 may be formed of, for example, an oxide layer.

The semiconductor fin 204 may include a pair of source/drain regions 210 and a channel region 212 extending between the pair of source/drain regions 210.

Above the channel region 212 of the semiconductor fin 204, a gate 220 may be formed. The gate 220 may extend in a direction (direction Y in FIG. 4A) that crosses an extension direction (direction X in FIG. 4A) of the semiconductor fin 204.

The gate 220 may form an MOS transistor TR1. The MOS transistor TR1 may be formed as a three-dimensional MOS transistor of which a channel is formed on the top and both side surfaces of the semiconductor fin 204.

A portion of the gate 220 on an upper portion of the semiconductor fin 204 may have a thickness that is identical with or greater than that along a vertical direction (direction Z of FIG. 4A) of the semiconductor fin 204. However, example embodiments are not limited thereto.

The gate 220 may have a side wall 220S extending from the buried insulating layer 206 to a desired (or alternatively, predetermined) height HBG in a vertical direction (direction Z in FIG. 4A)

According to some example embodiments, the gate 220 may be formed of, for example, doped polysilicon, metal, conductive metal nitride, metal silicide, alloys, or a combination thereof. For example, the gate 220 may include nitride of at least one metal selected from Al, Ti, Ta, W, Ru, Nb, Mb, or Hf.

A top surface of the gate 220 may be covered by an insulating capping layer 222. According to some example embodiments, the insulating capping layer 222 may be formed of, for example, a silicon nitride layer, a silicon oxide layer, or a combination thereof.

A gate dielectric layer 224 may be interposed between the channel region 212 and the gate 220. The gate dielectric layer 224 may be formed of, for example, a silicon oxide layer or a high dielectric layer having a higher dielectric constant than the silicon oxide layer.

A pair of corner insulating spacers 230 extending along the side walls 200s of the gate 220 and surfaces of the buried insulating layer 206 may be formed at both sides of the gate 220.

The corner insulating spacer 230 may extend along the side wall 220S of the gate 220 in a re-entrant corner portion C2 (refer to FIG. 5D) formed between the gate 220, the pair of source/drain regions 210 formed in the semiconductor fin 204, and the buried insulating layer 206.

As shown in FIG. 4B, the corner insulating spacer 230 may have a first surface 232 covering from a side portion of the gate dielectric layer 224, which is adjacent to the side wall 220S of the gate 120, to at least a portion of the side wall 220S of the gate 220, and a second surface 234 (refer to FIG. 5E) covering from a side portion of the gate dielectric layer 224 to a portion of the source/drain region 210. The first surface 232 of the corner insulating spacers 230 may directly contact the at least the portion of the side wall 220S of the gate 220. The second surface 234 may directly contact the portion of the source/drain region 110.

The first surface 232 of the corner insulating spacer 230 may cover the side wall 220S of the gate 220 up to a first height HB1, which is smaller than the height HBG of the side wall 220S. According to some example embodiments, the first surface 232 of the corner insulating spacers 230 may cover the side wall 220S to various heights within a range that is not greater than the height HBG of the side wall 220S of the gate 220.

Above the pair of corner insulating spacers 230, a pair of outer portion insulating spacers 240 may be formed. The pair of outer portion insulating spacers 240 may extend to a second height HB2, which is greater than the first height HB1 on the buried insulating layer 206. In FIGS. 4A through 4C, it is illustrated that the second height HB2 of the outer portion insulating spacer 240 may reach to a level, which is greater than the height HBG of the side wall 220S of the gate 220 (e.g., the top surface of the gate 220) and lower than a top surface of the insulating capping layer 222. According to some example embodiments, the second height HB2 of the outer portion insulating spacer 240 may vary within the range between the first height HB1 of the corner insulating spacer 230 and the height of the top surface of the insulating capping layer 122.

The outer portion insulating spacer 240 may have a surface facing the remaining portion of the side wall 220S of the gate 220, which is not covered by the corner insulating spacer 230. The outer portion insulating spacer 240 may have a surface directly contacting the remaining portion of the side wall 220S of the gate 220, which is not covered by the corner insulating spacer 230. According to some example embodiments, when the side wall 220S of the gate 220 may be completely covered by the corner insulating spacer 230, the outer portion insulating spacer 240 may cover a side wall of the insulating capping layer 222 above the corner insulating spacer 230.

The outer portion insulating spacer 240 may have a dielectric constant which is smaller than that of the corner insulating spacer 230.

More detailed descriptions of the corner insulating spacer 230 and the outer portion insulating spacer 240 may be respectively the same as or substantially similar to those of the corner insulating spacer 130 and the outer portion insulating spacer 140 with reference to FIG. 1, and thus are omitted to avoid redundancy.

Each of the pair of source/drain regions 210 may include a source/drain extension region 210A having an impurity doping concentration that is relatively low and a deep source/drain region 210B having a higher impurity doping concentration than the source/drain extension region 210A.

Each of the corner insulating spacers 230 may have a width CW2 (refer to FIG. 4B) that is smaller than a horizontal distance L2 from the side wall 220S of the gate 220 to an outer wall of the outer portion insulating spacer 240 along a side wall of the semiconductor fin 204. The corner insulating spacer 230 formed on the side wall of the semiconductor fin 204 by the width CW2 may cover the source/drain region 210 formed in the semiconductor fin 204. Also, the corner insulating spacer 230 may cover the buried insulating layer 206 by the width CW2, which is less than the horizontal distance L2 of the outer portion insulating spacer 240 from the side wall 220S of the gate 220.

According to some example embodiments, the horizontal width CW2 of the corner insulating spacer 230 may be selected within a range of a half of the horizontal distance L2 from the side wall 220S of the gate 220.

According to some example embodiments, the source/drain extension region 210A may be excluded from the source/drain region 210. In such example embodiments, the deep source/drain region 210B may be formed to extend more toward the edge of the side wall 220S of the gate 220 compared with the deep source/drain region 110B illustrated in FIG. 4C.

In the semiconductor device 200A illustrated in FIGS. 4A through 4C, among insulating spacers extending along the side wall 220S of the gate 220, the corner insulating spacer 230, which is formed of an insulating material having a relatively high dielectric constant, may be disposed at an inner portion of the re-entrant corner portion C2 (refer to FIG. 5D) formed between the semiconductor fin 204, the gate 220, and the buried insulating layer 206. Thus, the occurrence of fringing capacitance in the semiconductor device 200A may be suppressed, and a characteristic of "ON" currents and a characteristic of "OFF" currents may be improved. Also, a deterioration of the performance of the transistor TR1 may be prevented. The outer portion insulating spacer 240, which is formed of an insulating material having a lower dielectric constant than the corner insulating spacer 230, may be formed as an outer portion of the insulating spacers that are formed in the re-entrant corner portion C2. Because parasitic capacitance may be reduced in the semiconductor device 200A due to the presence of the outer portion insulating spacer 240, the speed of operation of the transistor TR1 may be improved and power consumption may be reduced.

FIGS. 5A through 5K are cross-sectional views for describing an order of processes for manufacturing the semiconductor device of FIGS. 4A through 4C, according to an example embodiment. According to the present example embodiment, descriptions will be made of a method of manufacturing the semiconductor device 200A illustrated in FIGS. 4A through 4C. In FIGS. 5A through 5K, like reference numerals denote the like elements in FIGS. 4A through 4C, and thus their descriptions will not be repeated here.

Figure 5A:
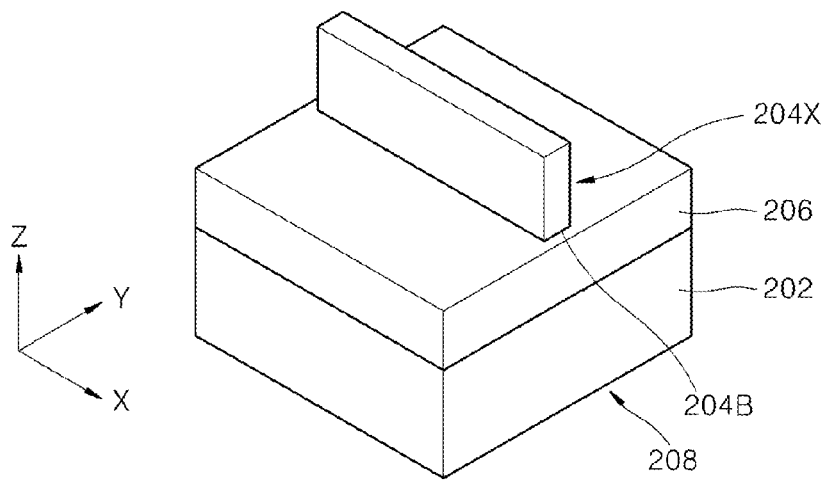
FIGS. 5A through 5K are cross-sectional views for describing an order of processes for manufacturing the semiconductor device of FIGS. 4A through 4C, according to an example embodiment.

Referring to FIG. 5A, after forming the SOI wafer 208 including two semiconductor layers and the buried insulating layer 206 between the two semiconductor layers, an upper semiconductor layer of the two semiconductor layers, which is above the buried insulating layer 206, may be partially removed so that a semiconductor fin pattern 204X remains on the buried insulating layer 206. The other of the two semiconductor layers, which is below the buried insulating layer 206, may remain as the substrate 202.

The semiconductor fin pattern 204X may extend in a direction (direction X in FIG. 5A) on the buried insulating layer 206. The semiconductor fin pattern 204X may have a base portion 204B contacting the buried insulating layer 206.

Although FIG. 5A illustrate an example of having one semiconductor fin pattern 204X, example embodiments are not limited thereto. The number of semiconductor fin patterns 204X may vary according to design requirements of the semiconductor device 200A.

According to some example embodiments, the substrate 202 and the semiconductor fin pattern 204X may be formed of, for example, Si.

Figure 5B:
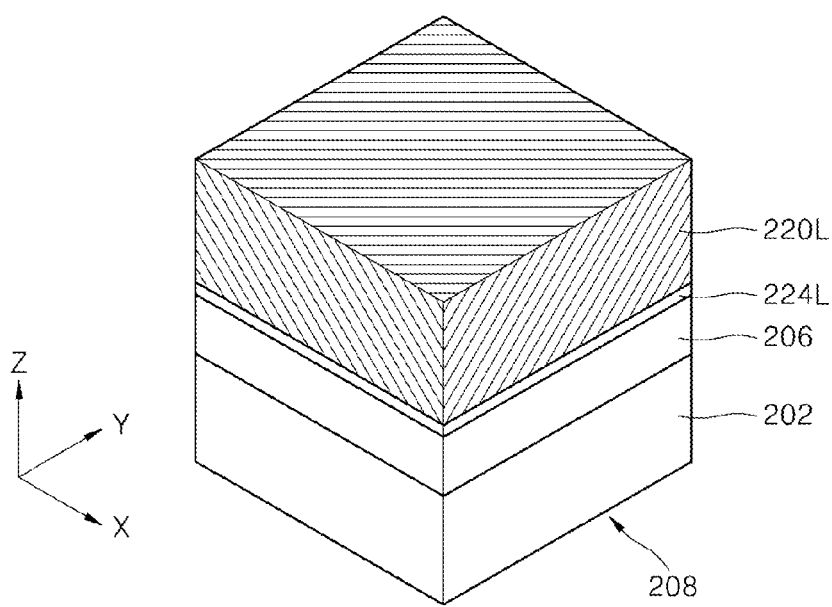

Referring to FIG. 5B, a dielectric layer 224L covering an exposed surface of the semiconductor fin pattern 204X illustrated in FIG. 5A and an exposed surface of the buried insulating layer 206 may be formed. A conductive layer 220L for forming a gate may be formed on the dielectric layer 224L to have a planarized top surface.

The dielectric layer 224L may be formed of, for example, a silicon oxide or a high dielectric layer. The conductive layer 220L may be formed of, for example, doped polysilicon, metal, conductive metal nitride, metal silicide, alloys, or a combination thereof. More detailed descriptions of the dielectric layer 224L and the conductive layer 220L are respectively the same as or substantially similar to those of the dielectric layer 124L and the conductive layer 120L with reference to FIG. 3A, and thus are omitted to avoid redundancy.

Figure 5C:
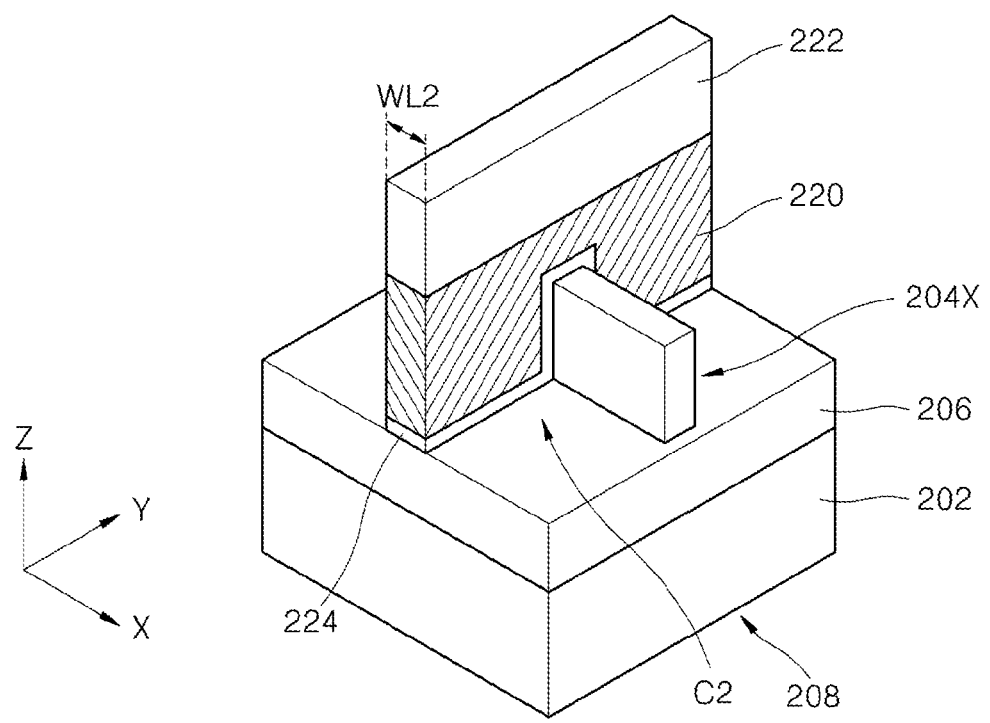

Referring to FIG. 5C, the insulating capping layer 222 may be formed on the conductive layer 220L illustrated in FIG. 5B by using a photolithography process. Then, the gate 220 and the gate dielectric layer 224 may be formed by sequentially etching the conductive layer 220L and the dielectric layer 224L by using the insulating capping layer 222 as an etch mask.

The gate 220 may extend in a direction (direction Y in FIG. 5C) that crosses an extension direction (direction X in FIG. 5C) of the semiconductor fin pattern 204X. According to some example embodiments, the gate 220 may be formed to have a line width WL2 of about 10 to about 30 nm, but example embodiments are not limited thereto.

The pair of re-entrant corner portions C2 may be formed between the gate 220, the semiconductor fin pattern 204X, and the buried insulating layer 206, at both sides of the gate 220. The gate dielectric layer 224 may be exposed in the re-entrant corner portion C2.

Figure 5D:
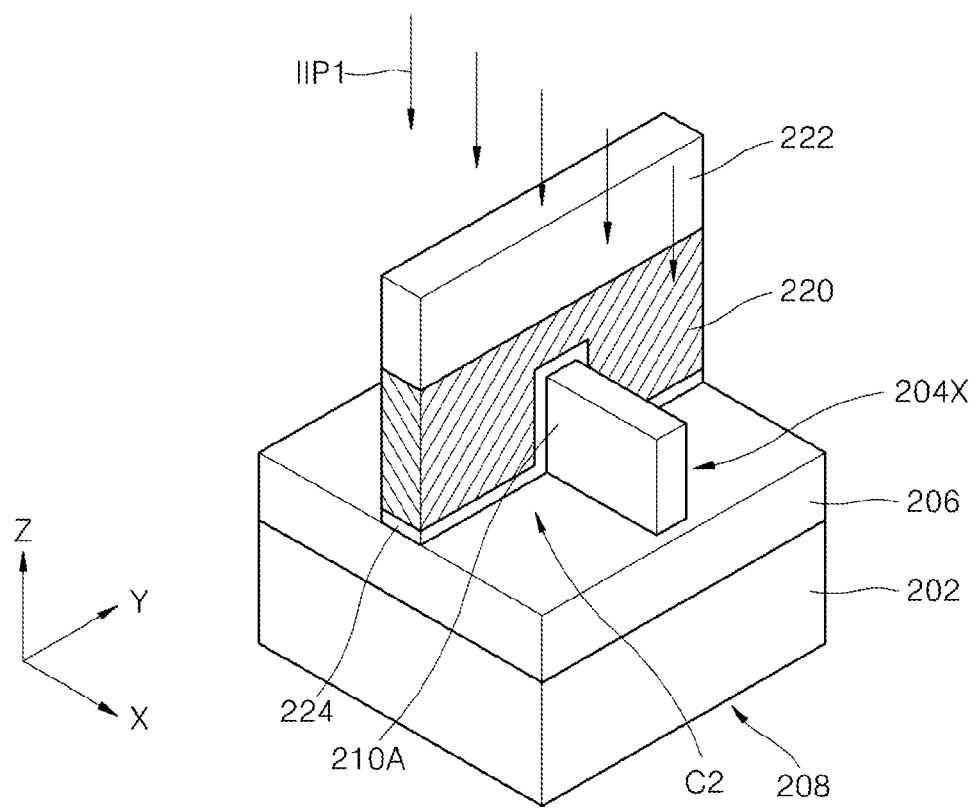

Referring to FIG. 5D, impurity ions IIP1 of a first doping concentration may be implanted into the semiconductor fin pattern 204X by using the insulating capping layer 222 as an ion implantation mask to form the source/drain extension regions 210A in the semiconductor fin pattern 204X at the both sides of the gate 220. The first doping concentration of the impurity ions IIP1 may be variously determined according to a design of the semiconductor device 200A.

According to some example embodiments, the process of implanting the impurity ions IIP1 to form the source/drain extension regions 210A may not be performed at this stage, but may instead be performed after a process of forming the pair of corner insulating spacers 230 as will be described with reference to FIG. 5E.

According to some example embodiments, before performing the impurity ions IIP1 implantation process for forming the source/drain extension regions 210A, an thin oxide layer to protect an exposed surface of the semiconductor fin pattern 204X and an exposed surface of the gate 220 may be formed prior to forming the source/drain extension regions 210A. After forming the source/drain extension regions 210A, the thin oxide layer may be removed by an wet etch process.

The gate 220, the gate dielectric layer 224, the source/drain extension region 210A, and the buried insulating layer 206 may be exposed in the re-entrant corner portions C2 at the both sides of the gate 220.

According to some example embodiments, the process of implanting the impurity ions IIP1 as described with reference to FIG. 5D may be omitted. Thus, the source/drain extension region 210A may not be formed in the semiconductor fin pattern 204X.

Figure 5E:
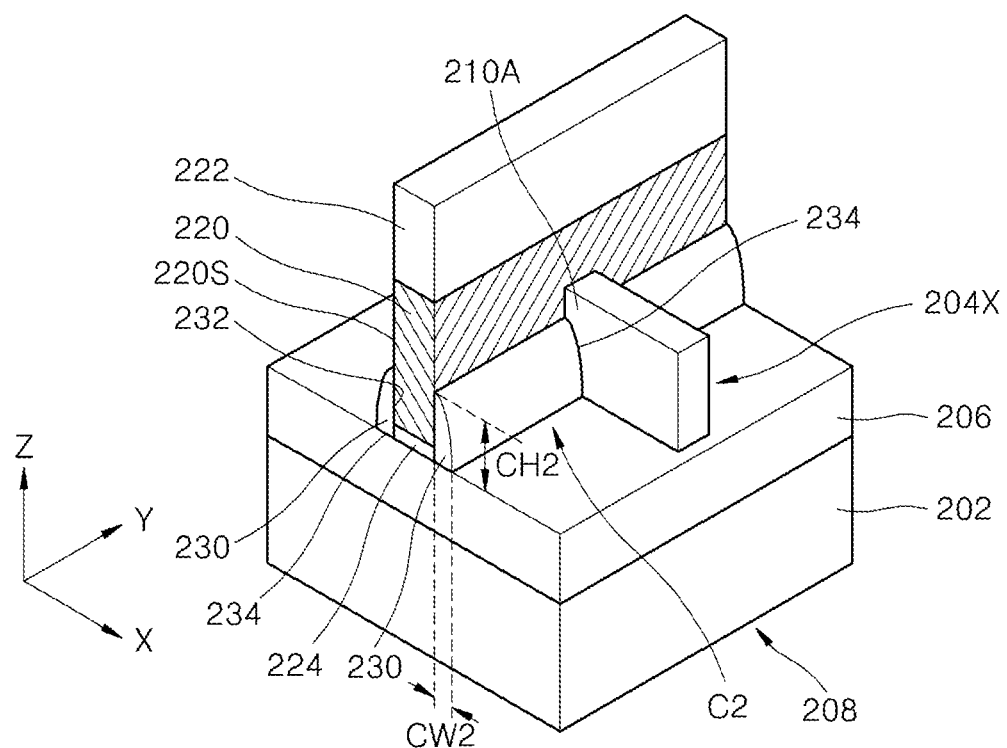

Referring to FIG. 5E, the corner insulating spacer 230 may be formed in the re-entrant corner portion C2 by etchback of a first insulating spacer layer (not shown) after forming the first insulating spacer layer (not shown) extending conformingly along a structure of a stack of the gate 220 and the insulating capping layer 222, and an exposed surface of the semiconductor fin pattern 204X. In the forming of the corner insulating spacer 230, the etchback time of the first insulating spacer layer (not shown) may be controlled so that the first insulating spacer layer (not shown) does not remain on the top surface of the semiconductor fin pattern 204X.

In the forming of the corner insulating spacer 230, a height in a vertical direction (direction Z in FIG. 5E) of the structure of the stack of the gate 220 and the insulating capping layer 222 may be greater than that of the semiconductor fin pattern 204X. For example, the height of the stack of the gate 220 and the insulating capping layer 222 may be sufficiently greater than that of the semiconductor fin pattern 204X. By doing so, while performing etchback on the first insulating spacer layer until the corner insulating spacers 230 remains at a desired height at the both sides of the gate 220, the first insulating spacer layer (not shown) on a portion of a side wall and a top surface of the semiconductor fin pattern 204X exposed by the gate 220 may be completely removed. As a result, at least a portion of the side wall of the semiconductor fin pattern 204X may be exposed in the re-entrant corner portion C2.

According to some example embodiments, the width CW2 of the corner insulating spacer 230 may be selected within a range of about 1 to about 20 nm, and the height CH2 of the corner insulating spacer 230 may be selected within a range of about 3 to about 60 nm, but the widths according to example embodiments are not limited thereto. The height CH2 may correspond to the first height HB1 illustrated in FIGS. 4A and 4B.

According to some example embodiments, the process of forming the source/drain extension regions 210A as described with reference to FIG. 5D may not be performed prior to the process of forming the pair of corner insulating spacers 230. For example, the impurity ions IIP1 implantation process for forming the source/drain extension regions 210A, as described with reference to FIG. 5D, may be performed after the process of forming the pair of corner insulating spacers 230, as described with reference to FIG. 5E. According to some example embodiments, after the impurity ions IIP1 are implanted into the semiconductor fin pattern 204X, the impurity ions IIP1 may be treated to diffuse up to an edge portion of the side wall 220S of the gate 220.

Figure 5F:
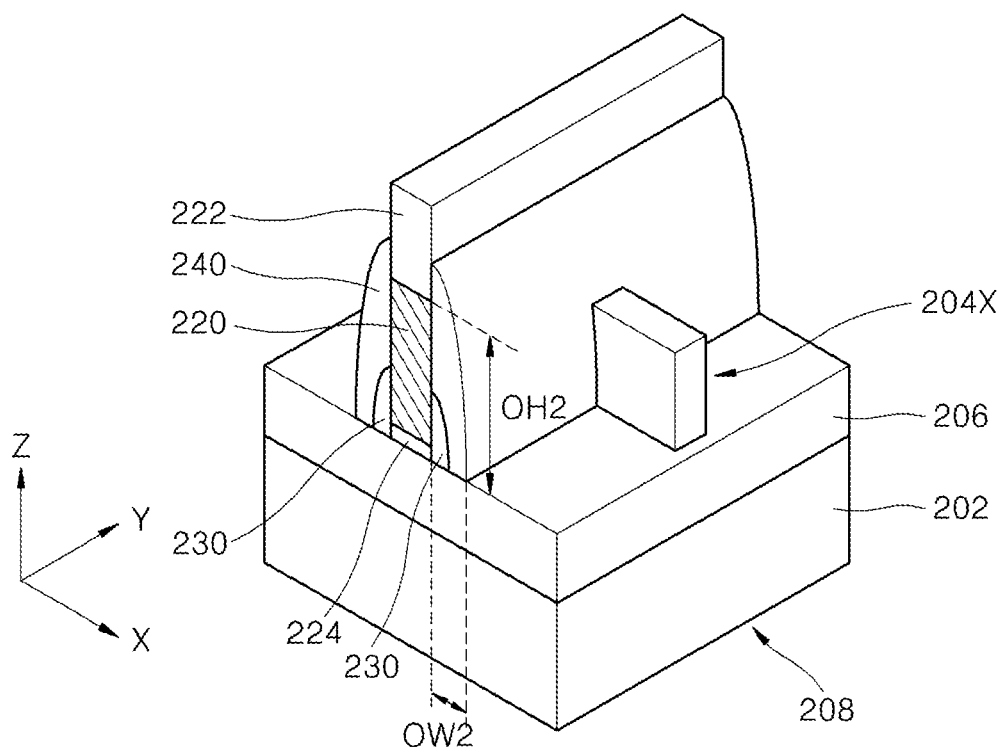

Referring to FIG. 5F, a second insulating spacer layer (not shown) extending conformingly along an exposed surface of a stack of the gate 220, the insulating capping layer 222, and the corner insulating spacer 230, the exposed surface of the semiconductor fin pattern 204X, and an exposed surface of the buried insulating layer 206 may be formed. Then, etchback may be performed on the second insulating spacer layer (not shown) to form the pair of outer portion insulating spacers 240 covering the pair of corner insulating spacer 230 in the re-entrant corner portion C2 (refer to FIG. 5E).

The outer portion insulating spacer 240 may be formed of a material having a smaller dielectric constant than a material of the corner insulating spacer 230.

A width OW2 of the outer portion insulating spacer 240 may be controlled by a thickness of the second insulating spacer layer (not shown). A height OH2 of the outer portion insulating spacer 240 may be controlled by the time during which the etchback process of the second insulating spacer layer (not shown) is performed. The height OH2 of the outer portion insulating spacer 240 may correspond to the second height HB2 illustrated in FIGS. 4A and 4B.

Figure 5G:
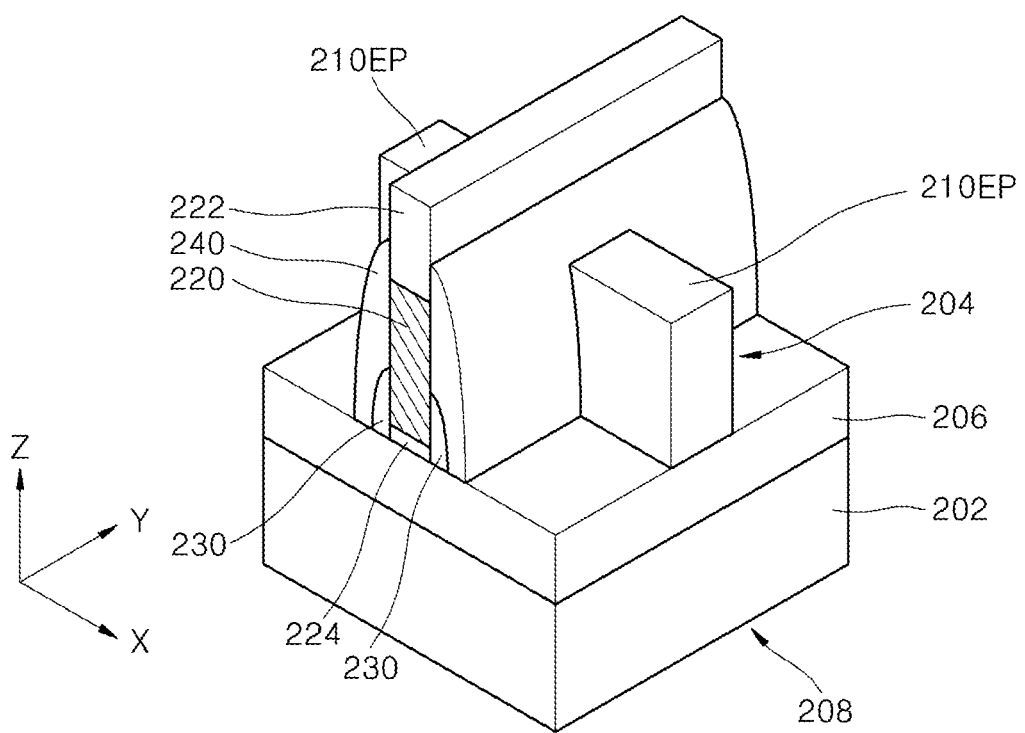

Referring to FIG. 5G, an epitaxial semiconductor layer 210EP may be formed on the exposed surface of the semiconductor fin pattern 204X illustrated in FIG. 5F to form a semiconductor fin 204 formed of the semiconductor fin pattern 204X and the epitaxial semiconductor layer 210EP.

To form the epitaxial semiconductor layer 210EP, a semiconductor layer may be epitaxially grown on the exposed surface of the semiconductor fin pattern 204X by using a selective epitaxial growth (SEG) process.

According to some example embodiments, the epitaxial semiconductor layer 210EP may be formed of, for example, the same semiconductor material as the semiconductor fin pattern 204X. According to other example embodiments, the epitaxial semiconductor layer 210EP may be formed of a different semiconductor material from the semiconductor fin pattern 204X. For example, the epitaxial semiconductor layer 210EP may be formed of Si, Ge, SiGe, SiC, or a combination thereof.

According to some example embodiments, a reduced pressure CVD (RPCVD) process may be used to form the epitaxial semiconductor layer 210EP. A precursor used to form the epitaxy semiconductor layer 210EP may include, for example, a gas containing Si (e.g., $SiH_4$) and/or a gas containing Ge (e.g., $GeH_4$), according to a composition of the epitaxial semiconductor layer to be formed. When the epitaxial semiconductor layer 210EP includes a SiGe layer, an atomic ratio of Ge to Si may be controlled by controlling a composition of the Si-containing Gas and the Ge-containing gas.

During the epitaxial growth process to form the epitaxial semiconductor layer 210EP, because of different growth rates on different crystal surfaces, a facet may be formed. For example, a growth speed on surface 111 may be lower than that on other surfaces (e.g., surface 110 or surface 100). To remove the facet formed due to the different growth rates on the different crystal surfaces, an etch gas (e.g., HC1) may be added to a process gas. According to some example embodiments, the epitaxial growth and etching may be performed in-situ in the same chamber. Thus, the epitaxial semiconductor layer 210EP may be formed to have a surface profile of a round shape.

The epitaxial semiconductor layer 210EP and the semiconductor fin pattern 204X may form the source/drain region after undergoing a subsequent ion implantation process.

According to a type of channel in a channel region in the semiconductor fin 204, the epitaxial semiconductor layer 210EP may be formed of a material causing tensile strain or compressive strain. The strain may contribute to improving the performance (e.g., carrier mobility) of the transistor. For example, the epitaxial semiconductor layer 210EP included in the semiconductor fin 204 in which an N channel is formed may be formed of SiC, which causes tensile strain. The epitaxial semiconductor layer 210EP included in the semiconductor fin 204 in which a P channel is formed, may be formed of SiGe, which causes compressive strain. However, example embodiments are not limited thereto.

The semiconductor fin 204 included the epitaxial semiconductor layer 210EP may enable the source/drain formed in the semiconductor fin 204 to have a raised source/drain (RSD) structure.

Figure 5H:
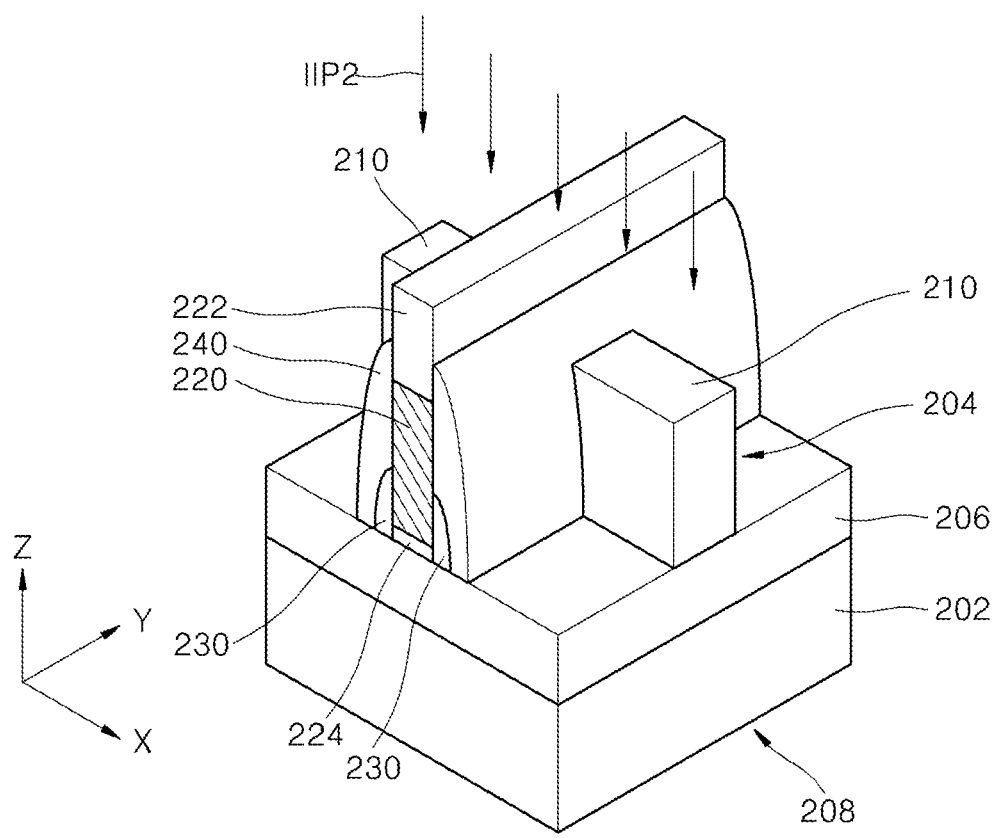

Referring to FIG. 5H, impurity ions IIP2 of a second doping concentration which is higher than the first doping concentration may be implanted into the semiconductor fin 204 by using the insulating capping layer 222 and the outer portion insulating spacer 240 as ion implantation masks to form the pair of deep source/drain regions 210B (refer to FIG. 4C) in the semiconductor fin 204 at the both sides of the gate 220 so that the pair of source/drain regions 210 are formed.

According to some example embodiments, the process of forming the source/drain extension region 210A described with reference to FIG. 5D may be omitted. For example, the source/drain region 210 may be formed in the semiconductor fin 204 only by the impurity ions IIP2 implantation process as described with reference to FIG. 5H.

Because the source/drain region 210 has an RSD structure including the epitaxial semiconductor layer 210EP, the thickness of the source/drain region 210 may increase so that overall parasitic capacitance may be reduced.

Although not shown in the drawings, a metal silicide layer may be formed by performing a salicide process on the surface of the source/drain region 210, in order to reduce resistance in the source/drain region 210. According to some example embodiments, the metal silicide layer may include a metal formed of cobalt (Co), nickel (Ni), platinum (Pt), palladium (Pd), vanadium (V), titanium (Ti), tantalum (Ta), ytterbium (Yb), zirconium (Zr), or a combination thereof. To form the metal silicide layer, a process of forming a metal layer on the surface of the source/drain region 210, a process of reacting the metal layer with the source/drain region 210, and a process of removing an unreacted portion of the metal layer may be included.

Figure 5I:
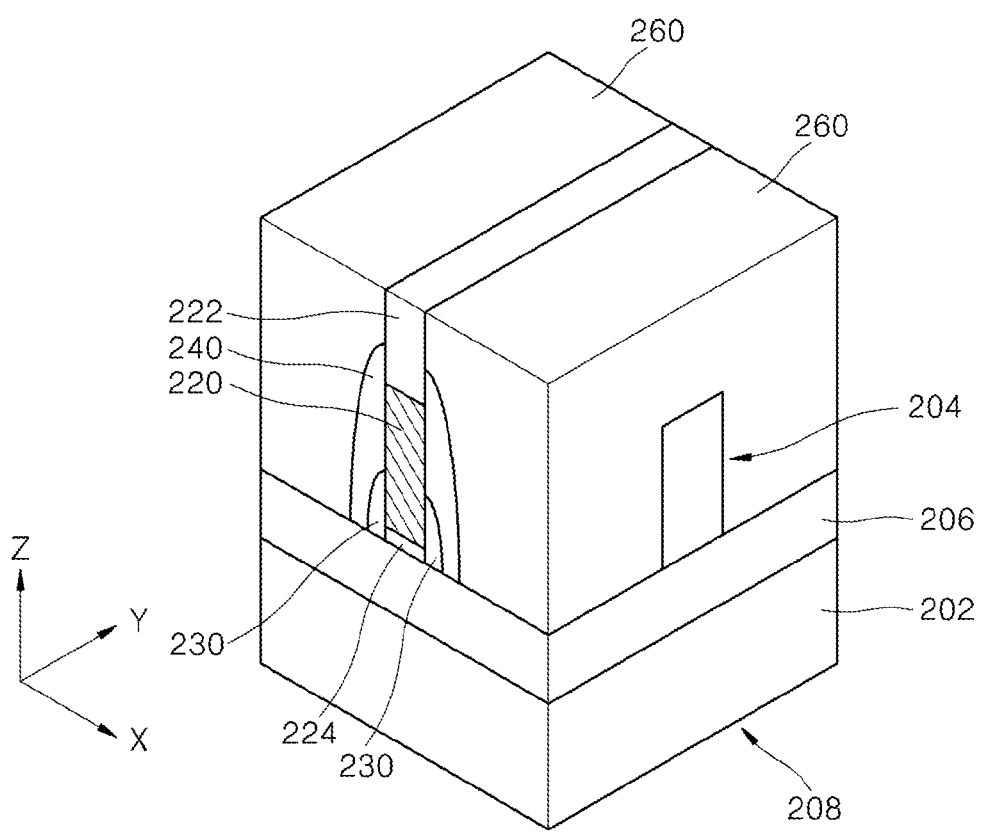

Referring to FIG. 5I, an interlayer insulating layer 260 having a planarized top surface may be formed by depositing an insulating material on the resultant structure including the semiconductor fin 204, in which the source/drain region 210 is formed.

According to some example embodiments, the interlayer insulating layer 260 may be formed of, for example, a silicon oxide layer, a silicon nitride layer, a silicon oxynitride layer, or an ultra low K (ULK) layer having an ultra low dielectric constant K of about 2.2 to about 2.4 (e.g., a SiOC layer or a SiCOH layer).

Figure 5J:
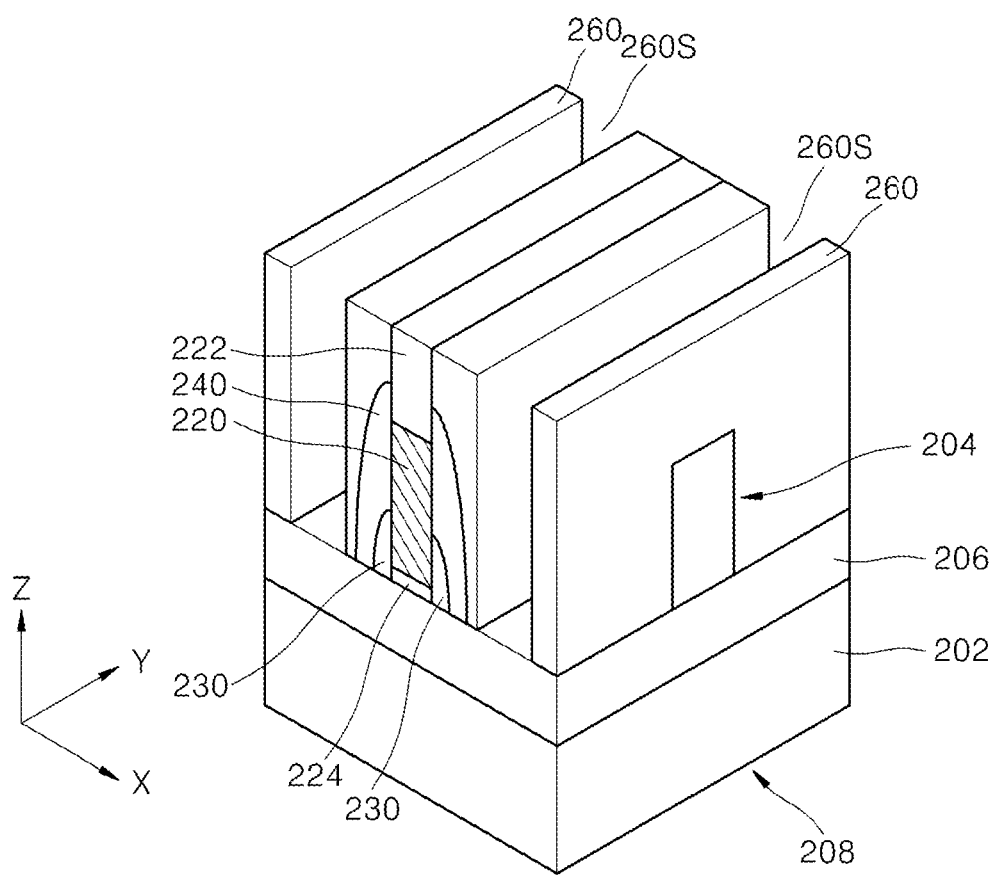

Referring to FIG. 5J, by partially etching the interlayer insulating layer 260, an opening 260S of a slot shape that exposes the source/drain region 210 in the semiconductor fin 204 may be formed.

According to the present example embodiment, the opening 260S is illustrated as having a slot shape, but example embodiments are not limited thereto. For example, the opening 260S may have a hole shape.

Figure 5K:
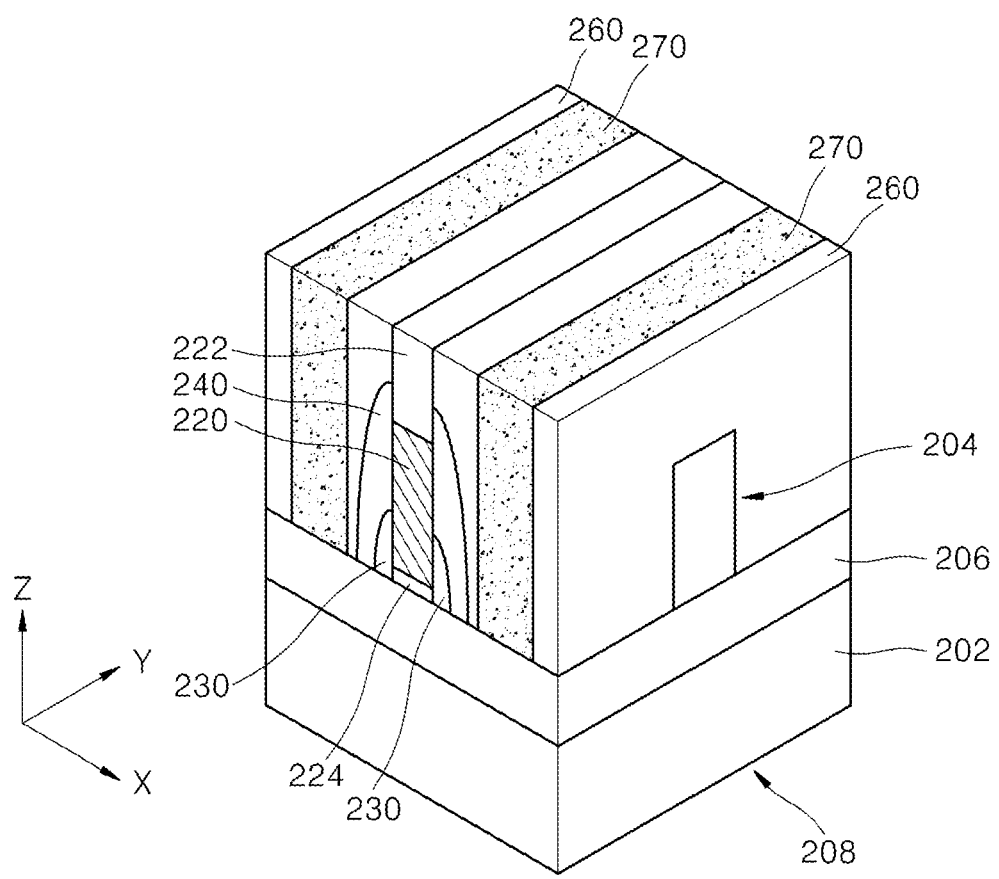

Referring to FIG. 5K, after forming a conductive layer by depositing a conductive material in the opening 260S illustrated in FIG. 5J and on the interlayer insulating layer 260, a portion of the semiconductor layer may be removed until a top surface of the interlayer insulating layer 260 is exposed, by using, for example, a chemical mechanical polishing (CMP) process or an etchback process, in order to form a contact plug 270 contacting the source/drain region 210 in the opening 260S.

Figure 6:
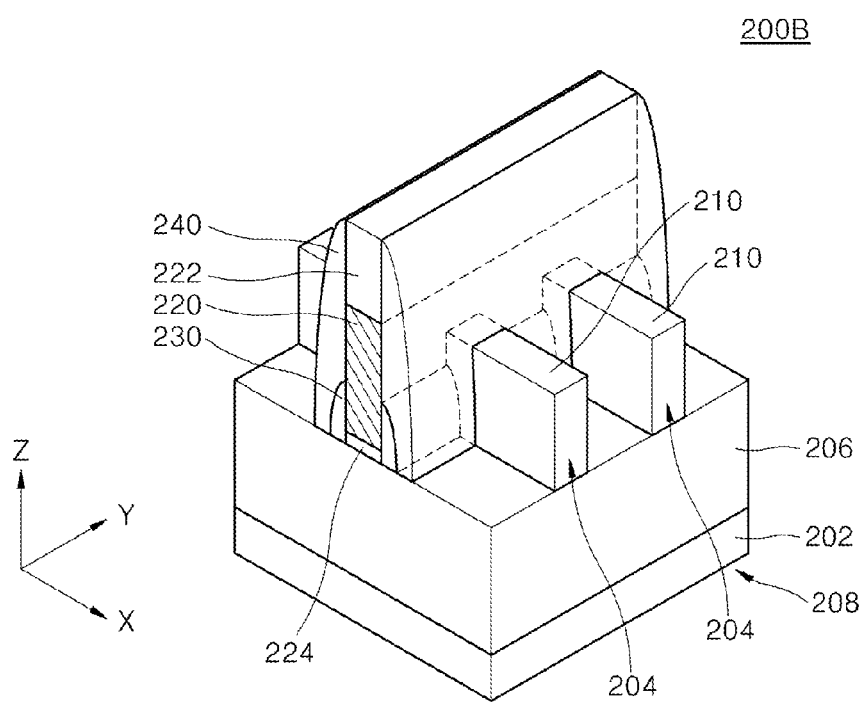
FIG. 6 is a perspective view for describing main elements of a semiconductor device according to another example embodiment.

FIG. 6 is a perspective view for describing main elements of a semiconductor device according to another example embodiment.

Except that a semiconductor device 200B includes two semiconductor fins 204, the semiconductor device 200B has substantially the same configuration as the semiconductor device 200A illustrated in FIGS. 3A through 3C. Although FIG. 6 illustrates two semiconductor fins 204, the three or more semiconductor fins 204 may be formed according to design requirements of a semiconductor device.

Figure 7A:
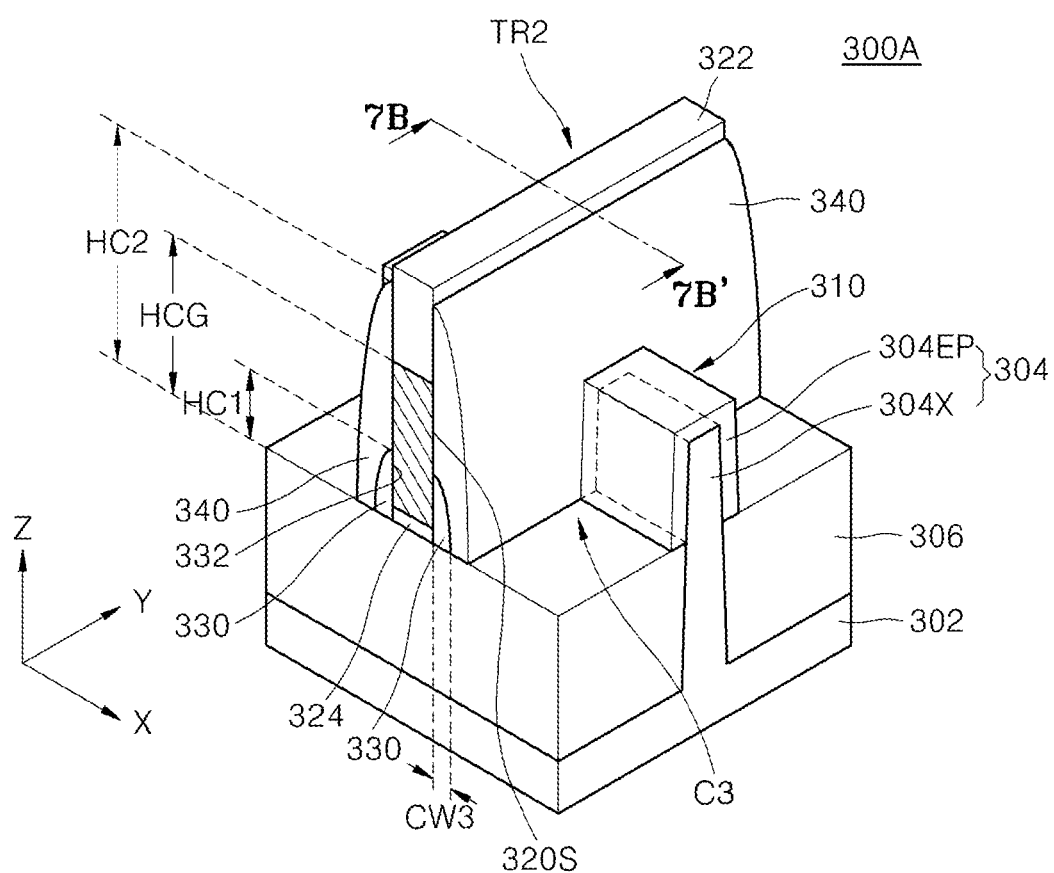
Figure 7B:
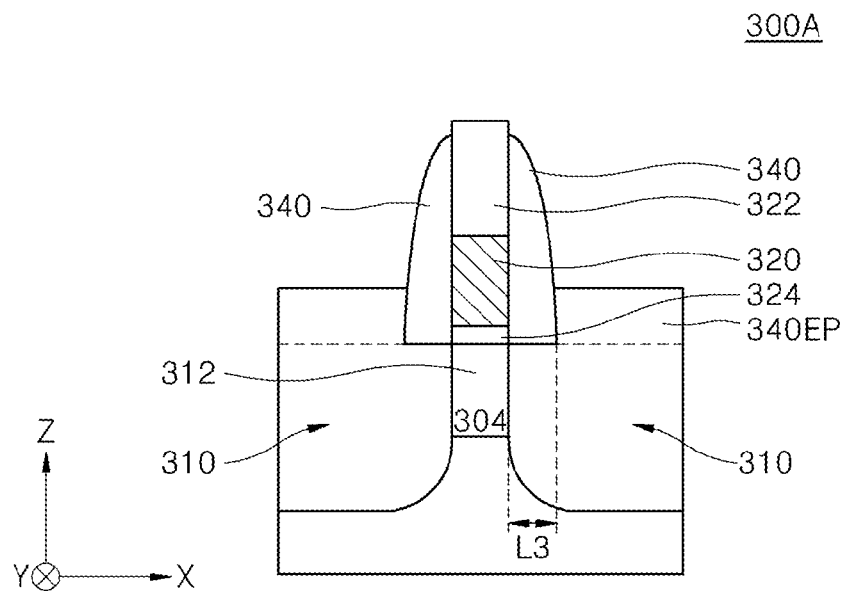

FIGS. 7A and 7B are views for describing main elements of a semiconductor device according to still another example embodiment. FIG. 7A is a perspective view of a portion of the semiconductor device. FIG. 7B is a vertical cross-sectional view taken along line 7B-7B' of FIG. 7A. FIGS. 7A and 7B illustrate the semiconductor device formed as a fin FET manufactured using a bulk substrate.

A semiconductor device 300A may include a semiconductor layer 304 extending in a direction (direction X in FIGS. 7A and 7B). The semiconductor layer 304 may include an active region 304X formed of a semiconductor fin protruding from a substrate 302 and extending in a first direction. The present example embodiment illustrates a structure that one semiconductor layer 304 is formed. However, example embodiments are not limited thereto, and a plurality of semiconductor layers 304 may be formed on the substrate 302.

The semiconductor layer 304 may further include an epitaxial semiconductor layer 304EP covering a portion of a top surface and both side walls of the active region 304X.

According to some example embodiments, the substrate 302 may include, for example, a semiconductor (e.g., Si or Ge). According to other example embodiments, the substrate 302 may include, for example, a compound semiconductor (e.g., Ge, SiGe, SiC, GaAs, InAs, or InP). According to some example embodiments, the substrate 302 may include a conductive region, for example, a well doped with impurities, or a structure doped with impurities.

The active region 304X may extend along a direction (direction X in FIGS. 7A and 7B). A device isolation layer 306 may be formed around the active region 304X on the substrate 302. The active region 304X may protrudes above the device isolation layer 306 in a fin shape.

The semiconductor fin 304 may include a pair of source/drain regions 310 and a channel region 312 extending between the pair of source/drain regions 310.

A gate 320 may extend above the device isolation layer 306 on the substrate 302. The gate 320 may extend in a direction (direction Y in FIGS. 7A and 7B) crossing the active region 304X, while covering the top and both side surfaces of the active region 304X. The gate 320 may form an MOS transistor TR2. The MOS transistor TR2 may be formed as an MOS transistor having a three-dimensional structure, of which the channel 312 of the MOS transistor is formed in the top or both side surfaces of the active region 304X.

The gate 320 may have a side wall 320S that extends to a desired (or alternatively, predetermined) height HCG in a vertical direction (direction Z in FIG. 7A) from the device isolation layer 306.

According to some example embodiments, the gate 320 may be formed of, for example, doped polysilicon, metal, conductive metal nitride, metal silicide, alloys, or a combination thereof. For example, the gate 320 may include at least one metal selected from Al, Ti, Ta, W, Ru, Nb, Mo, or Hf, or nitride thereof.

A top surface of the gate 320 may be covered by an insulating capping layer 322. According to example embodiments, the insulating capping layer 322 may be formed of, for example, a silicon nitride layer, a silicon oxide layer, or a combination thereof.

A gate dielectric layer 324 may be interposed between the channel region 312 and the gate 320. The gate dielectric layer 324 may be formed of, for example, a silicon oxide layer or a high dielectric layer having a higher dielectric constant than the silicon oxide layer.

At both sides of the gate 320, a pair of corner insulating spacers 330 extending along the side walls 320S of the gate 320 and top surfaces of the device isolation layer 306 may be formed.

The corner insulating spacer 330 may extend along the side wall 320S of the gate 320 in a re-entrant corner portion C3 (refer to FIGS. 8C and 8D) formed between the gate 320, the active region 304X, and the device isolation layer 306.

The corner insulating spacer 330 may have a first surface 332 covering from a side portion of the gate dielectric layer 324, which is adjacent to the side wall 320S of the gate 320, to at least a portion of the side wall 320S of the gate 320, and a second surface 334 (refer to FIG. 8D) covering a portion of the active region 304X. The first surface 332 of the corner insulating spacer 330 may directly contact the at least the portion of the side wall 320S of the gate 320. The second surface 334 may directly contact the portion of the active region 304X.

The first surface 332 of the corner insulating spacer 330 may cover the side wall 320S of the gate 320 up to a first height HC1, which is smaller than the height HCG of the side wall 320S. For example, the first surface 332 of the corner insulating spacer 330 may cover the side wall 320S to various heights within a range that is not greater than the height HCG of the side wall 320S of the gate 320.

A pair of outer portion insulating spacers 340 may be formed above the pair of corner insulating spacers 330. The outer portion insulating spacer 340 may extend to a second height HC2, which is greater than the first height HC1, on the device isolation layer 306. In FIGS. 7A and 7B, it is illustrated that the second height HC2 of the outer portion insulating spacers 340 reaches to a level that is higher than the top surface of the gate 320 and is lower than the top surface of the insulating capping layer 322. For example, the second height HC2 of the outer portion insulating spacer 340 may be appropriately selected within the range of the first height HC1 of the corner insulating spacer 330 and the height of the top surface of the insulating capping layer 322.

The outer portion insulating spacer 340 may cover a remaining portion of the side wall 320S of the gate 320, which is not covered by the corner insulating spacer 330. The outer portion insulating spacer 340 may have a surface directly contacting the remaining portion of the side wall 320S of the gate 320, which is not covered by the corner insulating spacer 330. According to some example embodiments, when the side wall 320S of the gate 320 is completely covered by the corner insulating spacer 330, the outer portion insulating spacer 340 may cover a side wall of the insulating capping layer 322 above the corner insulating spacer 330.

The outer portion insulating spacer 340 may have a smaller dielectric constant than the corner insulating spacer 330.

More detailed descriptions of the corner insulating spacer 330 and the outer portion insulating spacer 340 are respectively the same as those of the corner insulating spacer 130 and the outer insulating spacer 140 with reference to FIG. 1, and thus are omitted to avoid redundancy.

Each of the corner insulating spacers 330 may have a width CW3 (refer to FIG. 7A) that is smaller than a horizontal distance L3 from the side wall of the gate 320 to the outer wall of the outer portion insulating spacer 340. The corner insulating spacer 330 may cover the device isolation layer 306 by the width CW3 within a range of a distance corresponding to the horizontal distance L3 from the side wall 320S of the gate 320.

According to some example embodiments, the horizontal width CW3 of the corner insulating spacer 330 may be selected within a range of a half of the horizontal distance L3 from the side wall 320S of the gate 320.

In FIG. 7B, although it is illustrated that the source/drain region 310 extends to the epitaxial semiconductor layer 304EP, to the bottom of the epitaxial semiconductor layer 304EP, and/or to the bottom of the outer portion insulating spacer 340, Example embodiments are not limited thereto.

In the semiconductor device 300A illustrated in FIGS. 7A and 7B, among the insulating spacers extending along the side wall 320S of the gate 320, the corner insulating spacer 330, which is formed of an insulating material having a relatively high dielectric constant, may be disposed at an inner portion of the re-entrant corner portion C3 formed between the active region 304X, the gate 320, and the device isolation layer 306. Thus, the occurrence of fringing capacitance in the semiconductor device 300A may be suppressed, and a characteristic of "ON" currents and a characteristic of "OFF" currents may be improved. Also, a deterioration of the performance of the MOS transistor TR2 may be prevented. The outer portion insulating spacer 340, which is formed of an insulating material having a lower dielectric constant than the corner insulating spacer 330, may be formed as an outer portion of the insulating spacers formed in the re-entrant corner portion C3. Accordingly, parasitic capacitance may be reduced in the semiconductor device 300A. Thus, the speed of operation of the MOS transistor TR2 may be improved and/or power consumption may be reduced.

FIGS. 8A through 8G are cross-sectional views for describing an order of processes for manufacturing the semiconductor device of FIGS. 7A and 7B, according to an example embodiment. According to the present embodiment, descriptions will be made of a method of manufacturing the semiconductor device 300A illustrated in FIGS. 7A and 7B. In FIGS. 8A through 8G, like reference numerals denote the like elements in FIGS. 7A and 7B, and thus their descriptions will not be repeated here.

Figure 8A:
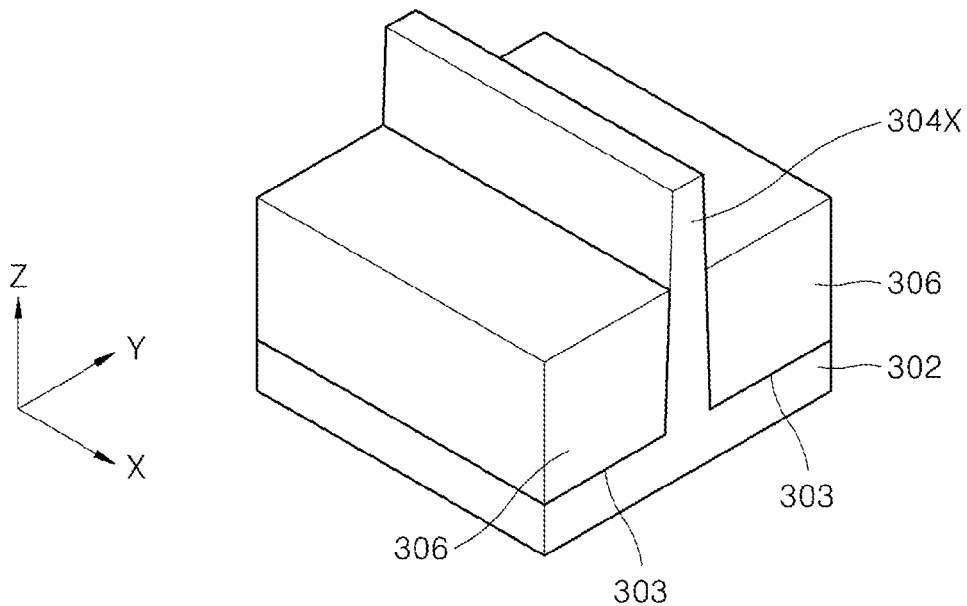
FIGS. 8A through 8G are cross-sectional views for describing an order of processes for manufacturing the semiconductor device of FIGS. 7A and 7B, according to an example embodiment.

Referring to FIG. 8A, a trench 303 for device isolation may be formed in the substrate 302 to form a plurality of fin-shaped active regions 304X protruding upward from the substrate 302 and extending in a direction (for example, direction Z in FIG. 8A). The plurality of fin-shaped active regions 304X may include p-type or n-type impurity diffusion regions.

Then, after forming an insulating layer filling the trenches 303 for device isolation and covering the plurality of active regions 304X, etchback may be performed on the insulating layer so as that the insulating layer remains at lower portions of the trenches 303 for device isolation, and thus a plurality of device isolation layers 306 filling portions of the trenches 303 for device isolation may be formed. As a result, the plurality of active regions 304X may protrude upward over the plurality of device isolation layers 306 and may be exposed by the device isolation layers 306.

The plurality of device isolation layers 306 may be formed of, for example, a silicon oxide layer, a silicon nitride layer, a silicon oxynitride layer, or a combination thereof. The plurality of device isolation layers 306 may include an insulation liner (not shown) formed of, for example, a thermal oxidation layer and a buried insulating layer (not shown) that reclaims a bottom of the trench 303.

Figure 8B:
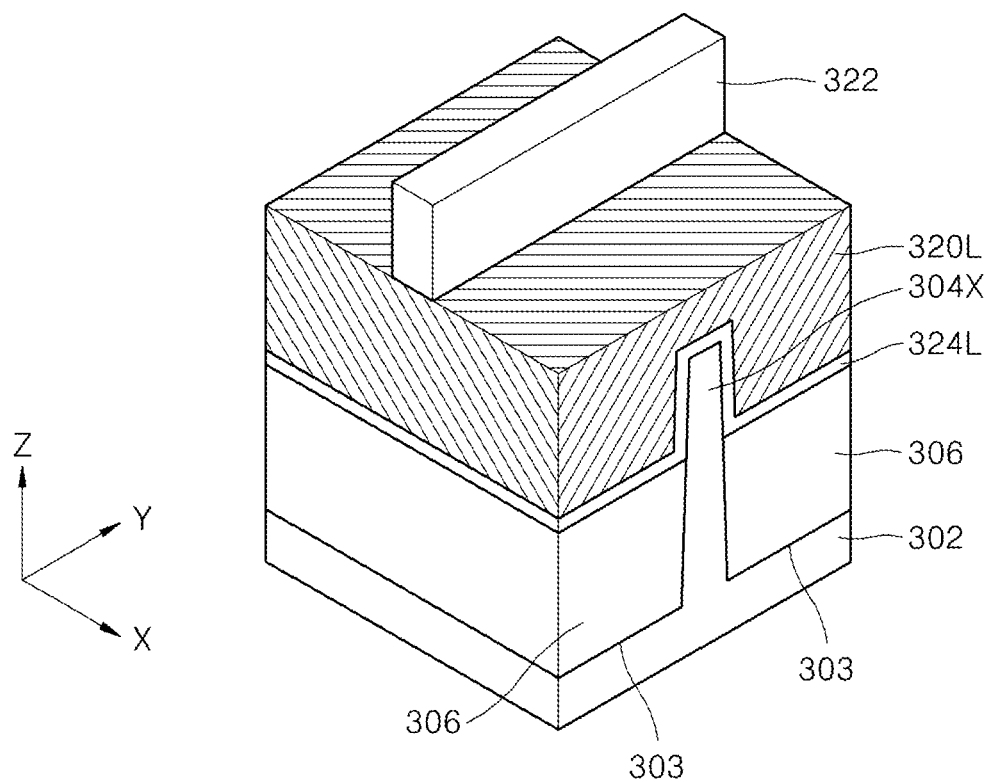

Referring to FIG. 8B, a dielectric layer 324L covering the device isolation layer 306 and the active region 304X may be formed on the substrate 302, and a conductive layer 320L having a planarized top surface may be formed on the dielectric layer 324L.

More detailed descriptions of the dielectric layer 324L and the conductive layer 320L are respectively the same as those of the dielectric layer 224L and the conductive layer 220L with reference to FIG. 5B, and thus are omitted to avoid redundancy.

Next, the insulating capping layer 322 may be formed on the conductive layer 320L by using a photolithography process. The insulating capping layer 322 may be formed to cover a portion of the top surface of the conductive layer 320L from which the gate 320 (refer to FIG. 8C) is to be formed.

Figure 8C:
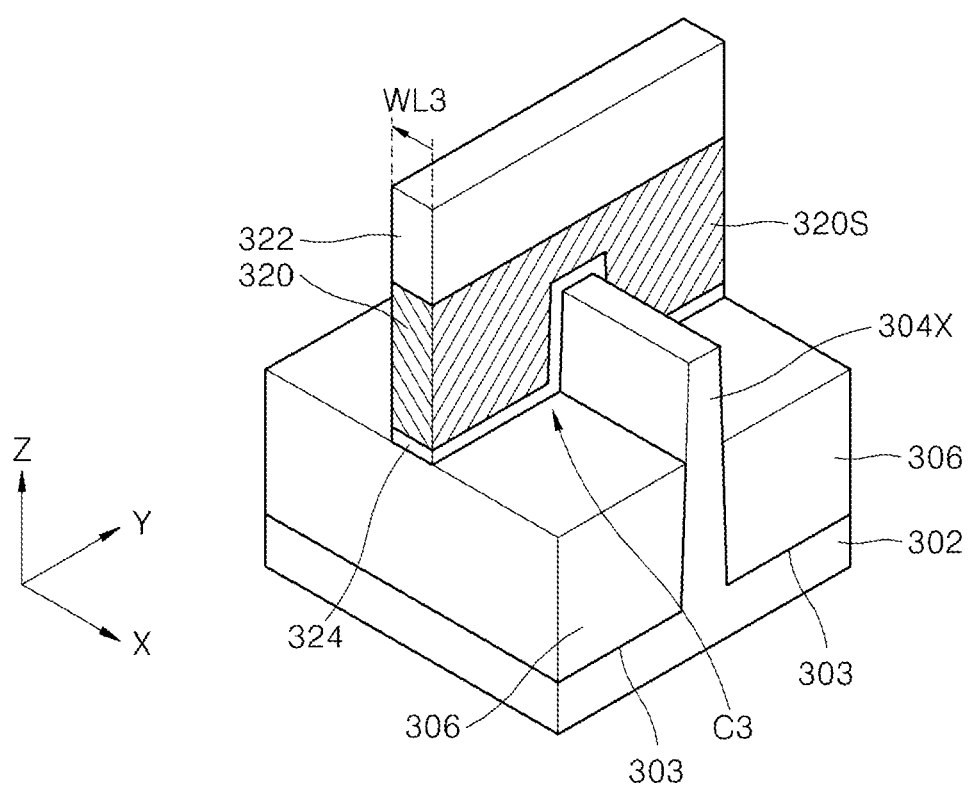

Referring to FIG. 8C, the gate 320 and the gate dielectric layer 324 may be formed by sequentially etching the conductive layer 320L and the dielectric layer 324L illustrated in FIG. 8B, by using the insulating capping layer 322 as an etch mask.

The gate 320 may extend in a direction (direction Y in FIG. 8C) that crosses an extension direction (direction X in FIG. 8C) of the active region 304X. According to some example embodiments, the gate 320 may be formed to have a line width WL3 of about 10 to about 30 nm, but it is not limited thereto.

At both sides of the gate 320, the pair of re-entrant corner portions C3 may be formed between the side walls 320S of the gate 320, the active region 304X, and the device isolation layer 306. The gate dielectric layer 324 may be exposed in the re-entrant corner portion C3.

Figure 8D:
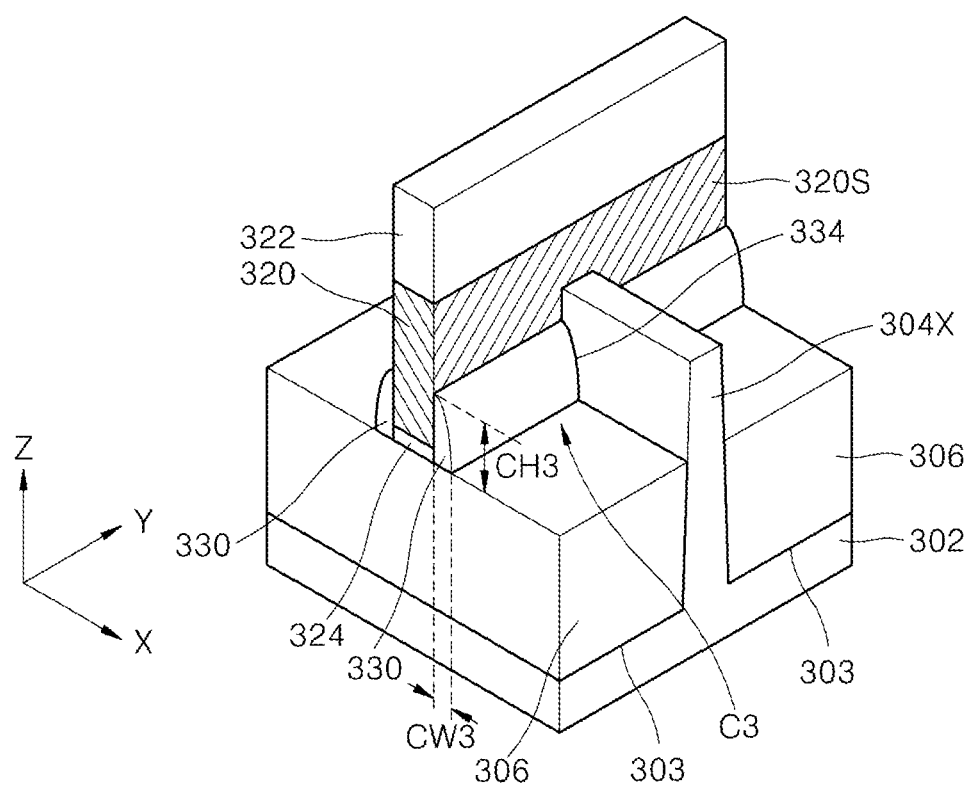

Referring to FIG. 8D, the corner insulating spacer 330 covering a portion of the side wall 320S of the gate 320 may be formed in the re-entrant corner portion C3 in a similar method as that described with reference to FIG. 5E.

A width CW3 of the corner insulating spacer 330 may be selected within a range of about 1 to about 20 nm, and a height CH3 of the corner insulating spacer 330 may be selected within a range of about 3 to about 60 nm, but are not limited thereto. The height CH3 of the pair of corner insulating spacers 330 may correspond to the first height HC1 illustrated in FIG. 7.

Figure 8E:
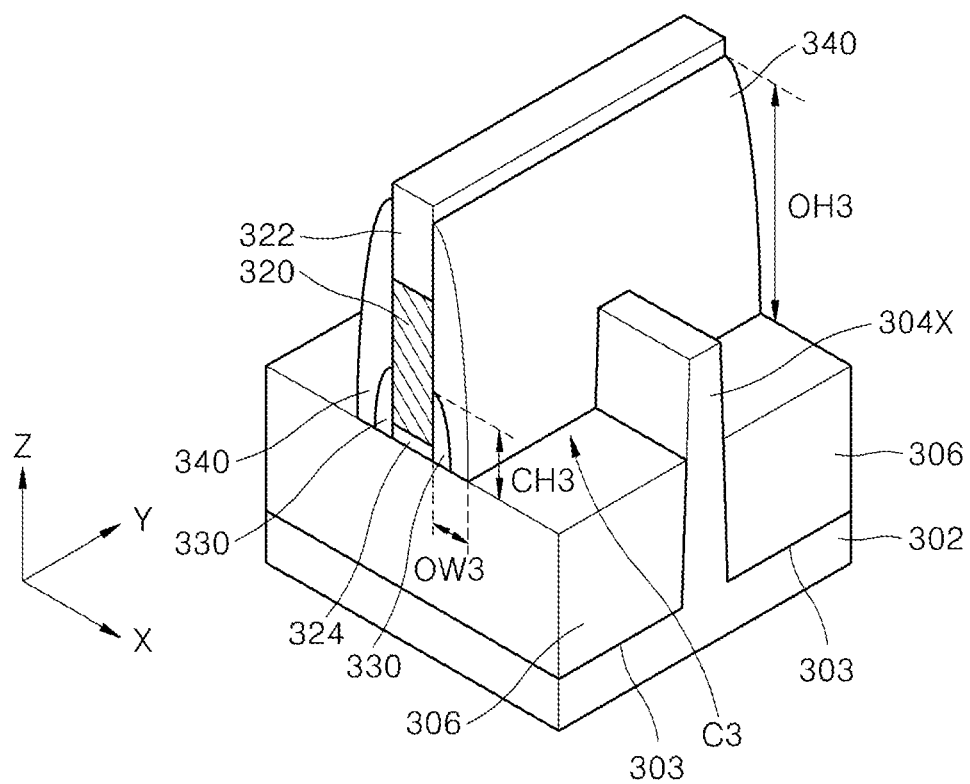

Referring to FIG. 8E, the outer portion insulating spacer 340 covering the corner insulating spacer 330 may be formed in the re-entrant corner portion C3 in a similar method as that described with reference to FIG. 5F.

The outer portion insulating spacer 340 may be formed of a material having a smaller dielectric constant than a material of the corner insulating spacer 330.

A width OW3 of the outer portion insulating spacer 340 may be greater than the width CW3 of the corner insulating spacer 330, and a height OH3 of the outer portion insulating spacer 340 is greater than the height CH3 of the corner insulating spacer 330. The height CH3 of the outer portion insulating spacer 340 may correspond to the second height HC2 illustrated in FIG. 7A.

Figure 8F:
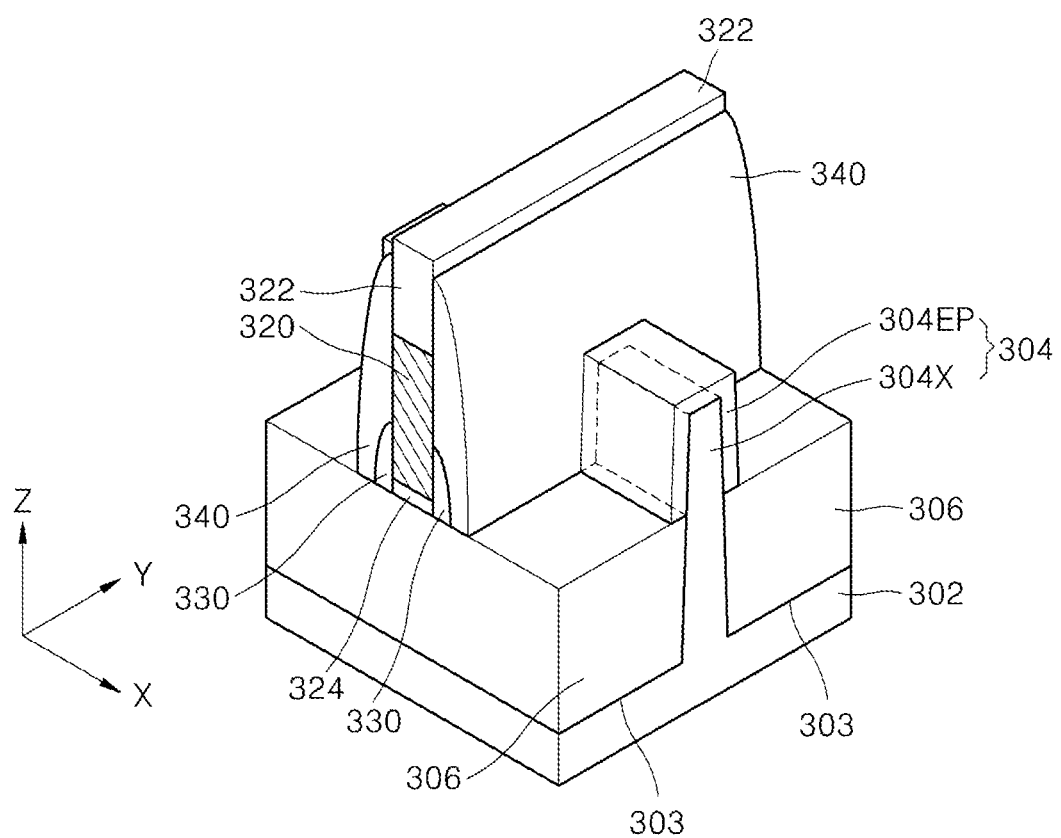

Referring to FIG. 8F, an epitaxial semiconductor layer 304EP may be formed on the exposed surface of the active region 304X illustrated in FIG. 8E to form a semiconductor fin 304 formed of the active region 304X and the epitaxial semiconductor layer 304EP.

More detailed descriptions of the epitaxial semiconductor layer 304EP and a method of forming the same are respectively the same as those of the epitaxial semiconductor layer 310EP and the method of forming the same with reference to FIG. 5G, and thus are omitted to avoid redundancy.

Because the semiconductor fin 304 includes the epitaxial semiconductor layer 304EP, the source/drain region formed on the semiconductor fin 304 may have an RSD structure.

Figure 8G:
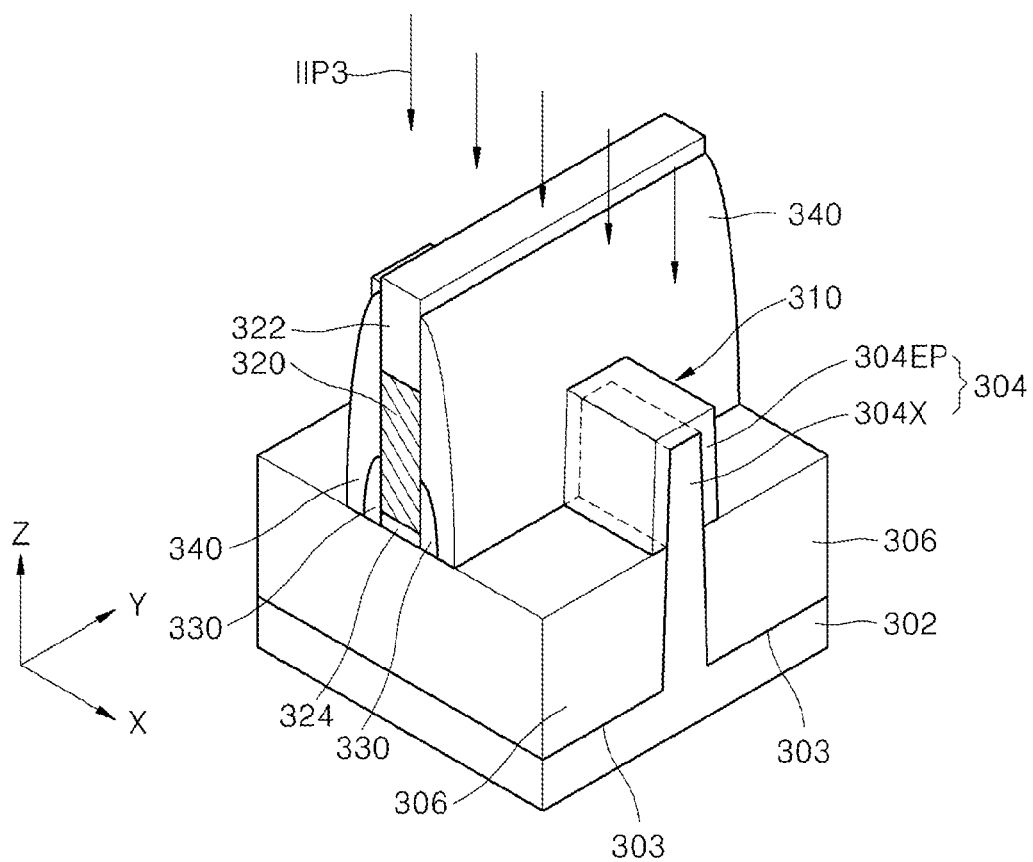

Referring to FIG. 8G, the pair of source/drain regions 310 may be formed on the semiconductor fin 304 at both sides of the gate 320 by implanting impurity ions IIP3 in the semiconductor fin 304 by using the insulating capping layer 322 and the outer portion insulating spacer 304 as ion implantation masks.

Although not shown, to reduce the resistance in the source/drain region 310, a metal silicide layer may be formed by performing a salicide process on the surface of the source/drain region 310, as described with reference to FIG. 5H.

Then, by using similar processes as described with reference to FIGS. 5I through 5K, the corner insulating spacer 330, the outer portion insulating spacer 340, and the pair of source/drain regions 310 may be covered by an interlayer insulating layer, and then a typical contact forming process may be performed.

Figure 9:
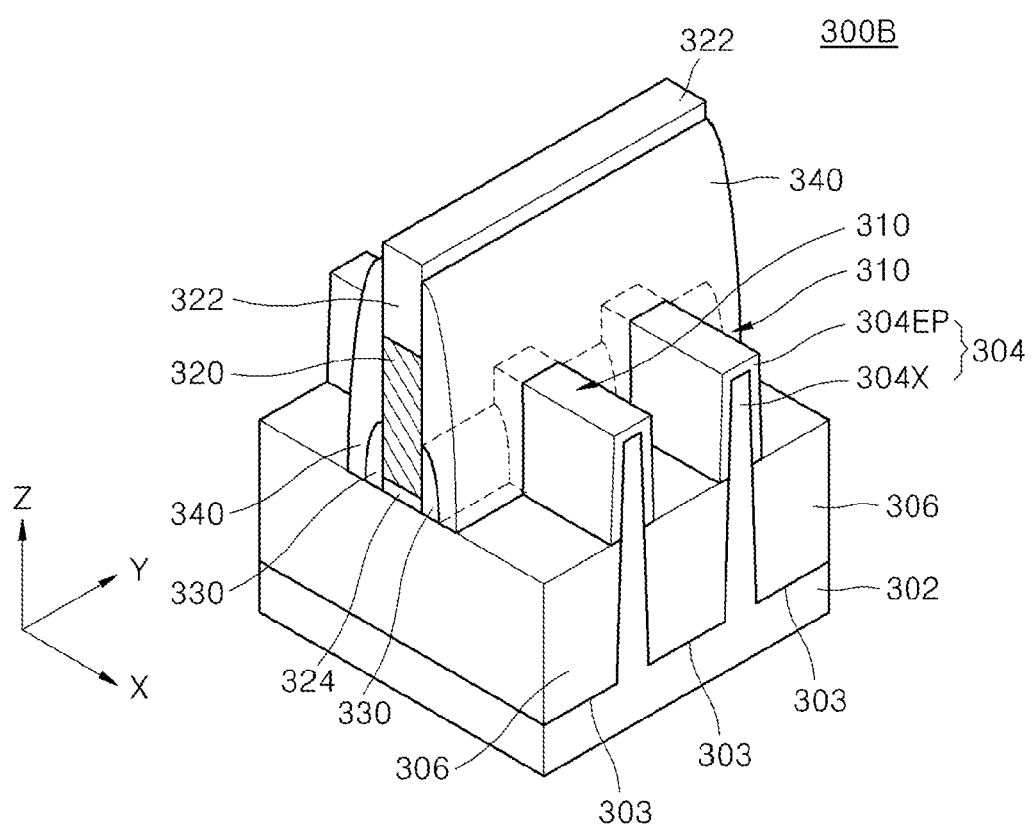
FIG. 9 is a perspective view for describing main elements of a semiconductor device, according to yet another example embodiment.

FIG. 9 is a perspective view for describing main elements of a semiconductor device according to yet another example embodiment.

Except that a semiconductor device 300B includes two semiconductor fins 304, the semiconductor device 300B has substantially the same structure as the semiconductor device 300A illustrated in FIGS. 7A and 7B. Though FIG. 9 illustrates two semiconductor fins 304 as an example, three or more semiconductor fins 304 may be formed, according to design requirement of a semiconductor device.

Figure 10:
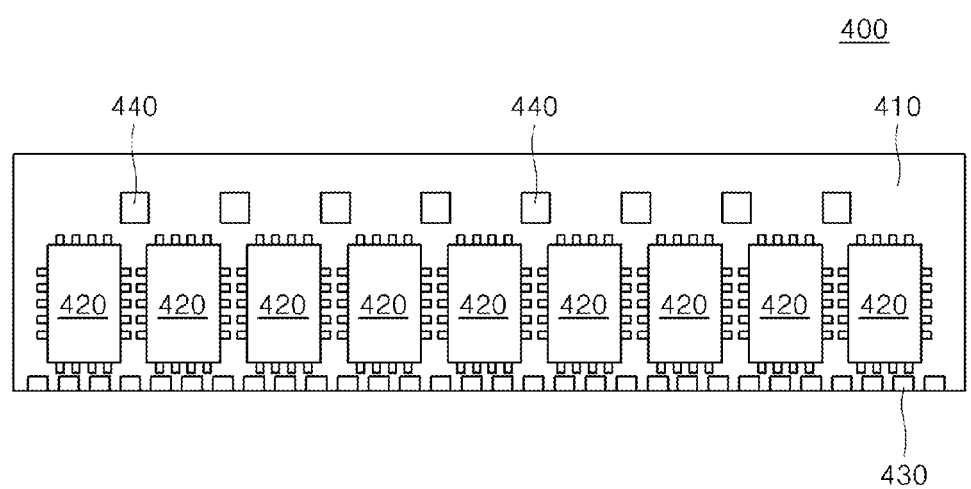
FIG. 10 is a plan view of a memory module according to an example embodiment.

FIG. 10 is a plan view of a memory module 400 according to an example embodiment.

A memory module 400 may include a module substrate 410 and a plurality of semiconductor chips 420 attached on the module substrate 410.

A semiconductor chip 420 may include a semiconductor device according to any of the present example embodiments above. The semiconductor chip 420 may include at least one of the semiconductor devices 100A, 100B, 200A, 200B, 300A, and 300B illustrated in FIGS. 1 through 9.

A contact portion 430 that may be inserted into a socket of a mother board may be disposed at a side of the module substrate 410. A ceramic decoupling capacitor 440 may be disposed on the module substrate 410. The memory modules according to example embodiments are not limited to the structure illustrated in FIG. 10, and may be manufactured in various forms.

Figure 11:
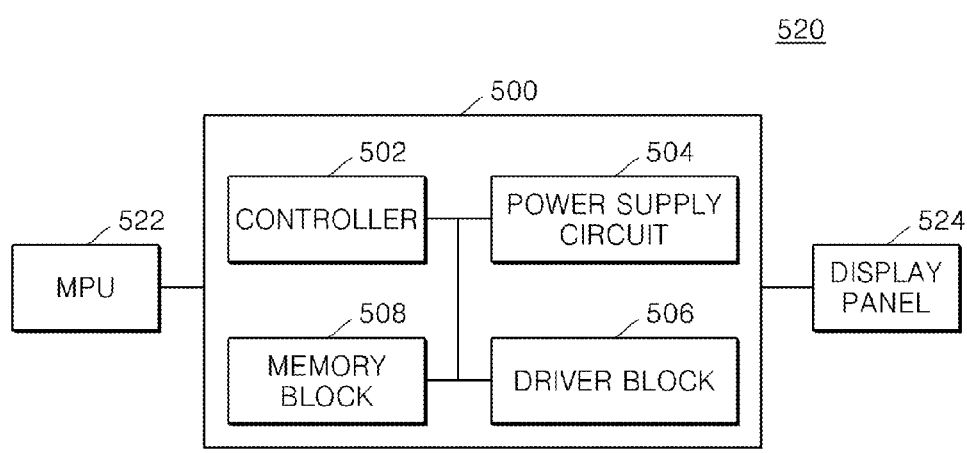
FIG. 11 is a block diagram of a display driving integrated circuit (DDI) and a display apparatus including the DDI, according to an example embodiment of the inventive concept.

FIG. 11 is a block diagram of a display driving integrated circuit (DDI) and a display apparatus including the DDI, according to an example embodiment.

Referring to FIG. 11, a DDI 500 may include a controller 502, a power supply circuit 504, a driver block 506, and a memory block 508. The controller 502 may receive and decode a command applied from a main processing unit (MPU) 522, and may control each of blocks of the DDI 500 to realize an operation according to the command. The power supply circuit 504 may generate a driving voltage in response to the control of the controller 502. The driver block 506 may drive a display panel 524 by using the driving voltage generated in the power supply circuit 504 in response to the control of the controller 502. The display panel 524 may be, for example, a liquid crystal display panel or a plasma display panel. The memory block 508 may temporarily store commands input to the controller 502 and control signals output from the controller 502. The memory block 508 may include memories, for example, random access memory (RAM), read only memory (ROM), as blocks for storing required data. At least one of the power supply circuit 504 and the driver block 506 may include at least one of the semiconductor devices 100A, 100B, 200A, 200B, 300A, and 300B illustrated in FIGS. 1 through 9.

Figure 12:
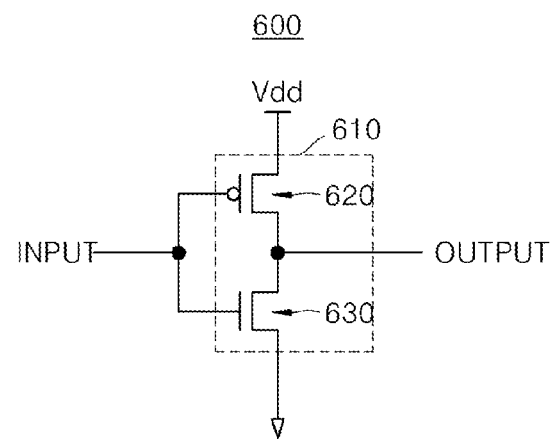
FIG. 12 is a circuit diagram of a complementary metal-oxide semiconductor (CMOS) inverter according to an example embodiment.

FIG. 12 is a circuit diagram of a complementary metal-oxide semiconductor (CMOS) inverter according to an example embodiment.

A CMOS inverter 600 may include a CMOS transistor 610. The CMOS transistor 610 may be formed of a p-type channel metal oxide semiconductor (PMOS) transistor 620 and a n-type channel metal oxide semiconductor (NMOS) transistor 630 that are connected between a power terminal Vdd and a ground terminal. The CMOS transistor 610 may include at least one of the semiconductor devices 100A, 100B, 200A, 200B, 300A, and 300B illustrated in FIGS. 1 through 9.

Figure 13:
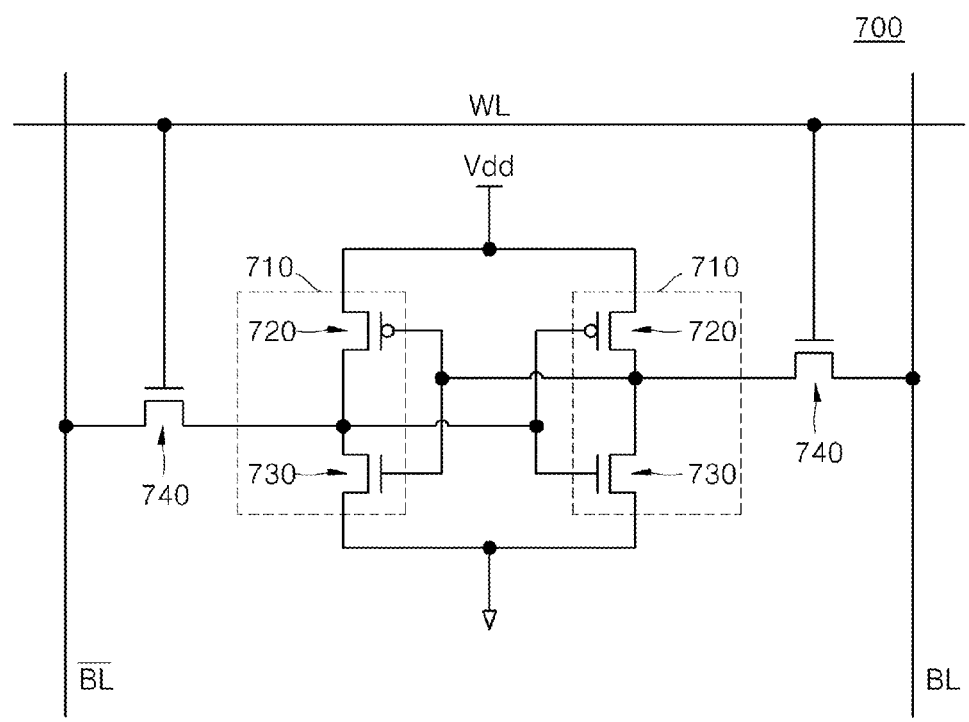
FIG. 13 is a circuit diagram of a CMOS static random-access memory (SRAM) device according to an example embodiment.

FIG. 13 is a circuit diagram of a CMOS static random-access memory (SRAM) device according to an example embodiment.

A CMOS SRAM device 700 may include a pair of driving transistors 710. The pair of driving transistors 710 may be formed of a PMOS transistor 720 and a NMOS transistor 730 that are connected between a power terminal Vdd and a ground terminal. The CMOS SRAM device 700 may further include a pair of transmission transistors 740. A source of the transmission transistor 740 may be cross-connected to a common node of the PMOS transistor 720 and the NMOS transistor 730 that form the driving transistor 710. The power terminal Vdd may be connected to the source of the PMOS transistor 720, and the ground terminal may be connected to a source of the NMOS transistor 730. A word line WL may be connected to a gate of the pair of transmission transistors 740, and a bit line BL and a reversed bit line may be connected to drains of the pair of transmission transistors 740.

At least one of the driving transistor 710 and the transmission transistor 740 of the CMOS SRAM device 700 may include at least one of the semiconductor devices 100A, 100B, 200A, 200B, 300A, and 300B illustrated in FIG. 1 through 9.

Figure 14:
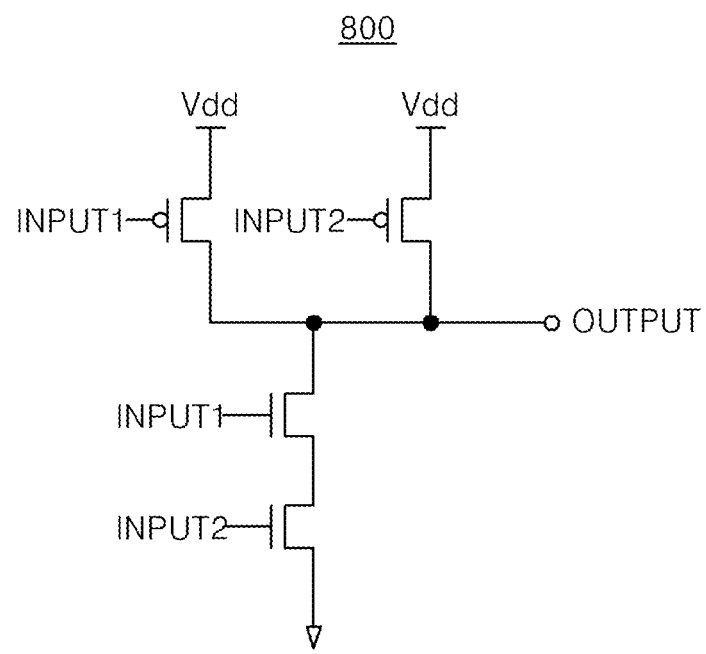
FIG. 14 is a circuit diagram of a CMOS NAND circuit according to an example embodiment.

FIG. 14 is a circuit diagram of a CMOS negated and or not and (NAND) circuit according to an example embodiment of the inventive concept.

A CMOS NAND circuit 800 may include a pair of CMOS transistors, to each of which different input signals are transmitted. The CMOS NAND circuit 800 may include at least one of the semiconductor devices 100A, 100B, 200A, 200B, 300A, and 300B illustrated in FIGS. 1 through 9.

Figure 15:
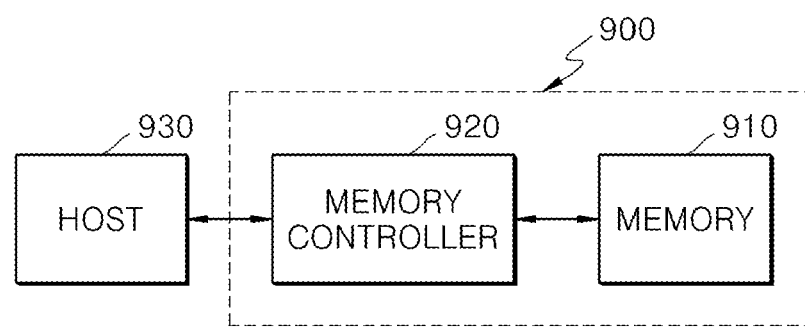
FIG. 15 is a block diagram of an electronic system according to an example embodiment.

FIG. 15 is a block diagram of an electronic system according to an example embodiment of the inventive concept.

An electronic system 900 may include a memory 910 and a memory controller 920. The memory controller 920 may control the memory 910 to read data from the memory 910 and/or to write data to the memory 910 in response to a request of a host 930. At least one of the memory 910 and the memory controller 920 may include at least one of the semiconductor devices 100A, 100B, 200A, 200B, 300A, and 300B illustrated in FIGS. 1 through 9.

Figure 16:
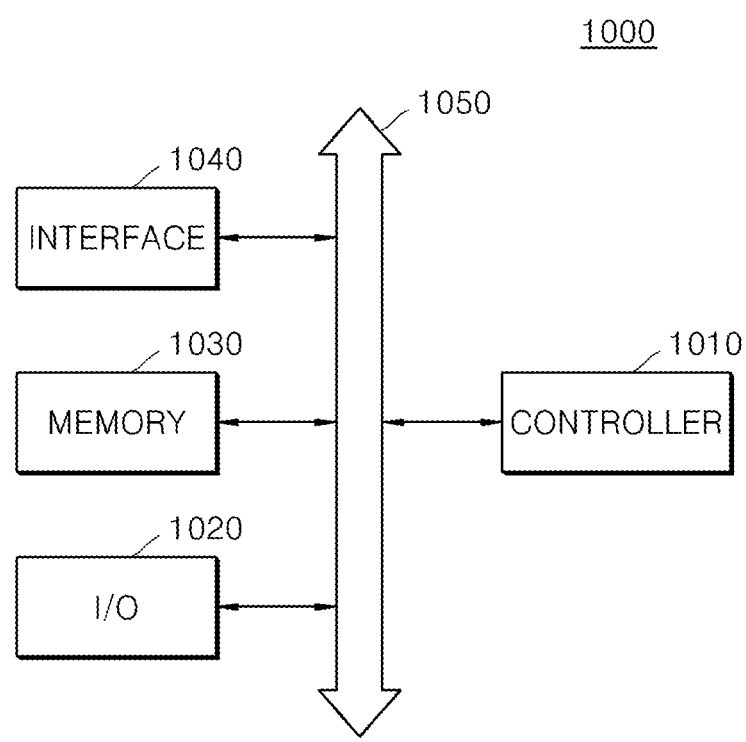
FIG. 16 is a block diagram of an electronic system according to another example embodiment.

FIG. 16 is a block diagram of an electronic system according to another example embodiment of the inventive concept.

An electronic system 1000 may include a controller 1010, an input and output (I/O) apparatus 1020, a memory 1030, and an interface 1040 that are connected to one another by a bus 1050.

The controller 1010 may include, for example, at least one of a microprocessor, a digital signal processor, or any processor of the kind. The I/O apparatus 1020 may include at least one of a keypad, a keyboard, and a display. The memory 1030 may be used to store commands processed by the controller 1010. For example, the memory 1030 may be used to store user data.

The electronic system 1000 may form a wireless communication apparatus or an apparatus that may transmit and/or receive information under a wireless environment. To transmit and receive data through a wireless communication network in the electronic system 1000, the interface 1040 may be configured as a wireless interface. The interface 1040 may include an antenna and/or a wireless transceiver. According to some example embodiments, the electronic system 1000 may be used as a communication interface protocol of a third generation communication system, for example, code division multiple access (CDMA), global system for mobile communications (GSM), north American digital cellular (NADC), extended-time division multiple access (E-TDMA), and/or wide band code division multiple access (WCDMA). The electronic system 1000 may include at least one of the semiconductor devices 100A, 100B, 200A, 200B, 300A, and 300B illustrated in FIGS. 1 through 9.

While example embodiments has been particularly shown and described with reference to some example embodiments disclosed herein, it will be understood that various changes in form and details may be made therein without departing from the spirit and scope of the following claims.

What is claimed is:

1. A semiconductor device comprising:
a semiconductor layer protruding from a substrate, the semiconductor layer having a channel region;
a device isolation layer covering both side walls of the semiconductor layer;
a gate extending on the channel region and on the device isolation layer, the gate having a first gate portion overlying the device isolation layer beside the semiconductor layer and a second gate portion overlying the channel region on a top surface of the semiconductor layer;
a gate dielectric layer interposed between the channel region and the gate;
a corner insulating spacer covering a first portion of a first side wall of the first gate portion, the first side wall of the first gate portion being a side wall of the first gate portion on the device isolation layer; and
an outer portion insulating spacer including a first portion and a second portion, the first portion covering and contacting a second portion of the first side wall of the first gate portion on the corner insulating spacer, the second portion of the first side wall being a portion of the first side wall exposed by the corner insulating spacer, and the second portion covering and contacting a second side wall of the second gate portion, the second side wall of the second gate portion being a side wall of the second gate portion on the top surface of the semiconductor layer, the outer portion insulating spacer having a smaller dielectric constant than the corner insulating spacer, not covering a top surface of the gate, and extending above the top surface of the gate.

2. The semiconductor device of claim 1, wherein the first gate portion has a first height, and the corner insulating spacer covers the first gate portion up to a second height smaller than the first height.

3. The semiconductor device of claim 1, wherein the corner insulating spacer directly contacts a lower portion of the first side wall of the first gate portion, and the first portion of the outer portion insulating spacer directly contacts an upper portion of the first side wall of the first gate portion.

4. The semiconductor device of claim 1, wherein the first gate portion has a first height and the outer portion insulating spacer has a third height greater than the first height.

5. The semiconductor device of claim 2, wherein the second gate portion has a fourth height smaller than the first height on the top surface of the semiconductor layer.

6. The semiconductor device of claim 1, wherein the corner insulating spacer has a first surface facing the first side wall of the first gate portion, a second surface facing a side wall of the semiconductor layer, a third surface facing the device isolation layer.

7. The semiconductor device of claim 1, wherein the corner insulating spacer has a width smaller than a horizontal distance from the first side wall of the first gate portion to an outer wall of the outer portion insulating spacer.

8. The semiconductor device of claim 1, wherein the corner insulating spacer covers the device isolation layer by a width smaller than a horizontal distance from the first side wall of the first gate portion to an outer wall of the outer portion insulating spacer.

9. The semiconductor device of claim 1, wherein the corner insulating spacer extends from a side wall of the semiconductor layer along the first side wall of the first gate portion.

10. The semiconductor device of claim 1, wherein the corner insulating spacer is not interposed between the second side wall of the second gate portion and the outer portion insulating spacer.

11. A semiconductor device comprising:
a fin-shaped active region protruding from a substrate and extending in a first direction; a device isolation layer formed around the fin-shaped active region on the substrate; a gate extending in a second direction on the device isolation layer and on the fin-shaped active region, the gate covering a top surface and both side surfaces of the fin-shaped active region and including a first side wall having a first height from the device isolation layer; a gate dielectric layer interposed between the fin-shaped active region and the gate; a plurality of corner insulating spacers formed on the device isolation layer, each of the plurality of corner insulating spacers covering the first side wall of the gate up to a second height smaller than the first height; and a plurality of outer portion insulating spacers each including a first portion and a second portion, the first portion covering and contacting a portion of the first side wall of the gate that is exposed by a corresponding one of the plurality of corner insulating spacers, and each of the plurality of outer portion insulating spacers having a third height greater than the first height and extending above a top surface of the gate.

12. The semiconductor device of claim 11, wherein the plurality of outer portion insulating spacers have a smaller dielectric constant than the plurality of corner insulating spacers.

13. The semiconductor device of claim 11, wherein the plurality of corner insulating spacers include a pair of corner insulating spacers spaced apart from each other with the fin-shaped active region interposed between the pair of corner insulating spacers.

14. The semiconductor device of claim 11, wherein the plurality of corner insulating spacers are arranged in a straight line extending along the second direction.

15. The semiconductor device of claim 11, wherein the plurality of corner insulating spacers have a height smaller than a height of the top surface of the fin-shaped active region, and the plurality of outer portion insulating spacers have a height greater than the height of the top surface of the fin-shaped active region.

16. The semiconductor device of claim 11, further comprising:
an insulating capping layer covering a top surface of the gate, wherein each of the plurality of outer portion insulating spacers has a surface contacting a side wall of the insulating capping layer.

17. The semiconductor device of claim 11, further comprising:
a pair of source/drain regions formed in the fin-shaped active region at opposite sides of the gate, wherein the plurality of corner insulating spacers and the plurality of outer portion insulating spacers have surfaces facing the pair of source/drain regions.

18. A semiconductor device comprising:
a fin-shaped active region protruding from a substrate;
a device isolation layer formed around the fin-shaped active region on the substrate;
a gate covering a top surface and both side surfaces of the fin-shaped active region, the gate extending on the device isolation layer to define re-entrant corner portions at opposite sides of the fin-shaped active region, each of the re-entrant corner portions formed between the gate, the fin-shaped active region, and the device isolation layer;
a plurality of corner insulating spacers extending along a side wall of the gate in the re-entrant corner portions, each of the plurality of corner insulating spacers covering lower portions of the side wall of the gate; and
a plurality of outer portion insulating spacers each including a first portion and a second portion, the first portion covering and contacting an upper portion of the side wall of the gate and a corresponding one of the plurality of corner insulating spacers, the plurality of outer portion insulating spacers having a smaller dielectric constant than the plurality of corner insulating spacers, each of the plurality of outer portion insulating spacers extending above a top surface of the gate.

19. The semiconductor device of claim 18, wherein the gate has a first height from the device isolation layer, and each of the plurality of corner insulating spacers has a height smaller than the first height.

20. The semiconductor device of claim 18, wherein the plurality of corner insulating spacers include a pair of corner insulating spacers spaced apart from each other with the fin-shaped active region interposed between the pair of corner insulating spacers, and the plurality of outer portion insulating spacers cover the upper portion of the side wall of the gate on the pair of corner insulating spacers.

\* \* \* \* \*